US006682859B2

(12) United States Patent
Moore et al.

(10) Patent No.: US 6,682,859 B2
(45) Date of Patent: Jan. 27, 2004

(54) VACUUM ULTRAVIOLET TRASMITTING SILICON OXYFLUORIDE LITHOGRAPHY GLASS

(75) Inventors: Lisa A. Moore, Corning, NY (US); Charlene M. Smith, Corning, NY (US)

(73) Assignee: Corning Incorporated, Corning, NY (US)

( * ) Notice: Subject to any disclaimer, the term of this patent is extended or adjusted under 35 U.S.C. 154(b) by 178 days.

(21) Appl. No.: 09/997,785

(22) Filed: Nov. 28, 2001

(65) Prior Publication Data

US 2002/0160276 A1 Oct. 31, 2002

Related U.S. Application Data

(63) Continuation-in-part of application No. 09/799,987, filed on Mar. 6, 2001, now Pat. No. 6,492,072, which is a continuation of application No. 09/397,573, filed on Sep. 16, 1999, now Pat. No. 6,242,136.
(60) Provisional application No. 60/135,270, filed on May 21, 1999, and provisional application No. 60/119,805, filed on Feb. 12, 1999.

(51) Int. Cl.[7] .............................. G03F 9/00; B32B 9/00
(52) U.S. Cl. ........................................... 430/5; 428/428
(58) Field of Search ............................ 430/5, 322, 323; 65/30.1; 501/53, 54, 57; 359/355; 428/428

(56) References Cited

U.S. PATENT DOCUMENTS

| 1,283,333 | A | * | 10/1918 | Shaw |
| 2,188,121 | A | * | 1/1940 | Smith .......................... 47/78.1 |
| 3,740,207 | A | * | 6/1973 | Bogrets et al. ................. 65/67 |
| 3,933,454 | A | * | 1/1976 | DeLuca ............................ 65/3 |
| 4,221,825 | A | * | 9/1980 | Guerder et al. ................ 427/34 |
| 4,345,928 | A | * | 8/1982 | Kawachi et al. .............. 65/18.2 |
| 4,363,647 | A | * | 12/1982 | Bachman et al. ............. 65/18.2 |
| 4,612,023 | A | * | 9/1986 | Kreutzer et al. ................. 65/32 |
| 4,650,511 | A | * | 3/1987 | Koya et al. .................... 65/30.1 |
| 4,666,495 | A | * | 5/1987 | Kreutzer et al. ............... 65/258 |
| 4,676,814 | A | * | 6/1987 | Ross et al. .................... 65/3.12 |

(List continued on next page.)

FOREIGN PATENT DOCUMENTS

| DE | 2704015 | 8/1978 | ........... C03B/23/04 |
| EP | 0 147 029 | 7/1985 | ......... C03B/37/016 |

(List continued on next page.)

OTHER PUBLICATIONS

Roger J. Araujo, Nicholas F. Borrelli and Charlene Smith, *Induced Absorption in Silica (A Prliminary Model)*, SPIE vol. 3424, 1998, pp. 25–32.

(List continued on next page.)

*Primary Examiner*—S. Rosasco
(74) *Attorney, Agent, or Firm*—Edward F Murphy; Siwen Chen

(57) ABSTRACT

High purity silicon oxyfluoride glass suitable for use as a photomask substrates for photolithography applications in the VUV wavelength region below 190 nm is disclosed with the silicon oxyfluoride glass having a preferred fluorine content<0.5 weight percent. The inventive silicon oxyfluoride glass is transmissive at wavelengths around 157 nm, making it particularly useful as a photomask substrate at the 157 nm wavelength region. The inventive photomask substrate is a "dry," silicon oxyfluoride glass which exhibits very high transmittance in the vacuum ultraviolet (VUV) wavelength region while maintaining the excellent thermal and physical properties generally associated with high purity fused silica. In addition to containing fluorine and having little or no OH content, the inventive silicon oxyfluoride glass suitable for use as a photomask substrate at 157 nm is also characterized by having less than $1\times10^{17}$ molecules/$cm^3$ of molecular hydrogen and low chlorine levels.

33 Claims, 19 Drawing Sheets

U.S. PATENT DOCUMENTS

| | | | | |
|---|---|---|---|---|
| 4,789,389 A | * | 12/1988 | Schermerhorn et al. | 65/31.2 |
| 4,917,718 A | * | 4/1990 | Berkey | 65/108 |
| 5,043,002 A | * | 8/1991 | Dobbins et al. | 65/31.2 |
| 5,326,729 A | * | 7/1994 | Yaba et al. | 501/54 |
| 5,364,433 A | * | 11/1994 | Nishimura et al. | 65/17.4 |
| 5,410,428 A | * | 4/1995 | Yamagata et al. | 359/350 |
| 5,415,953 A | * | 5/1995 | Alpay et al. | 430/5 |
| 5,474,589 A | * | 12/1995 | Ohga et al. | 65/397 |
| 5,599,371 A | * | 2/1997 | Cain et al. | 65/413 |
| 5,609,666 A | * | 3/1997 | Heitmann | 65/421 |
| 5,655,046 A | * | 8/1997 | Todoroki et al. | 385/144 |
| 5,667,547 A | * | 9/1997 | Christiansen et al. | 65/17.4 |
| 5,668,067 A | * | 9/1997 | Araujo et al. | 501/54 |
| 5,679,125 A | * | 10/1997 | Hiraiwa et al. | 65/397 |
| 5,683,483 A | * | 11/1997 | Yosiaki et al. | 65/102 |
| 5,698,484 A | * | 12/1997 | Maxon | 501/54 |
| 5,699,183 A | * | 12/1997 | Hiraiwa et al. | 359/355 |
| 5,702,495 A | * | 12/1997 | Hiraiwa et al. | 65/17.1 |
| 5,702,847 A | * | 12/1997 | Tarumoto et al. | 430/5 |
| 5,707,908 A | * | 1/1998 | Komine et al. | 501/53 |
| 5,735,921 A | * | 4/1998 | Araujo et al. | 65/32.1 |
| 5,764,345 A | * | 6/1998 | Fladd et al. | 356/35.5 |
| 5,837,024 A | * | 11/1998 | Fabian | 65/17.4 |
| 5,935,733 A | * | 8/1999 | Scott et al. | |
| 5,970,746 A | * | 10/1999 | Fujinoki et al. | 65/102 |
| 6,087,283 A | * | 7/2000 | Jinbo et al. | 501/54 |
| 6,242,136 B1 | * | 6/2001 | Moore et al. | 430/5 |
| 6,265,115 B1 | * | 7/2001 | Berkey et al. | 430/5 |
| 6,319,634 B1 | * | 11/2001 | Berkey et al. | 430/5 |

FOREIGN PATENT DOCUMENTS

| | | | |
|---|---|---|---|
| EP | 0 163 752 | 12/1985 | C03B/37/018 |
| EP | 0 401 845 | 12/1990 | G02B/1/00 |
| EP | 0 483 752 | 5/1992 | C03C/3/06 |
| EP | 0 636 586 | 2/1995 | C03C/3/06 |
| EP | 0 691 312 | 1/1996 | C03C/3/06 |
| EP | 0 735 006 | 10/1996 | C03B/32/00 |
| EP | 0 835 848 | 4/1998 | |
| EP | 0 870 737 | 10/1998 | C03C/3/06 |
| EP | 0 878 451 | 11/1998 | |
| EP | 0 901 989 | 3/1999 | C03B/19/14 |
| EP | 0 607 433 | 11/1999 | C03B/23/06 |
| EP | 1 084 995 | 3/2000 | C03B/19/14 |
| EP | 1 035 084 | 9/2000 | C03C/3/06 |
| GB | 257590 | 3/1927 | |
| GB | 2184434 | 6/1987 | C03B/20/00 |
| JP | 67-022389 | 11/1967 | |
| JP | 62-235223 | 10/1987 | C03B/20/00 |
| JP | 63-210044 | 8/1988 | C03C/17/245 |
| JP | 01-138145 | 5/1989 | |
| JP | 07-291635 | 11/1995 | |
| JP | 08-067530 | 3/1996 | |
| JP | P2001-19450 A | 1/2001 | C03B/20/00 |
| WO | 0 488 320 | 6/1992 | C03C/3/06 |
| WO | WO 98/52879 | 11/1998 | C03B/19/14 |
| WO | WO 00/24685 | 5/2000 | C03C/3/06 |

OTHER PUBLICATIONS

George H. Beall, *Industrial Applications of Silica,* Reviews in Minerology, 29, pp. 469–505.

N.F. Borrelli, Charlene Smith, Douglas C. Allan and T.P. Seward III, *Densification of fused silica under 193–nm excitation,* J. Opt. Soc. Am B/Vol 14, No. 7/Jul. 1997, pp. 1606–1615.

J.W. Fleming and D.L. Wood, *refractive index dispersion and related properties in fluorine doped silica,* Applied Optics/vol. 22, No. 19/Oct. 1, 1983, pp. 3102–3104.

David L. Griscom, *Optical Properties and Structure of Defects in Silica Glass,* The Centennial Memorial Issue, 99[10], 1991, pp. 926–942.

Hideo Hosono, Masafumi Mizuguchi, and Hiroshi Kawazoe, *Effects of fluorine dimer excimer laser radiatiotn on the optical transmission and defect formation of various types of synthetic $SiO_2$ glasses,* Applied Physics Letters, vol. 74, No. 19, May 10, 1999, pp. 2755–2757.

Toshio Ibuki et al., *Absorption Spectra of $SiCl_4$, $SiCl_6$, $SiF_3CH_3$ and $GeF_4$ In the VUV Region,* Chemical Physics Letters, vol. 136, No. 5, May 15, 1987, pp. 447–450.

W.D. Kingery, H.K. Brown, and D. R. Uhlmann, *Introduction to Ceramics, Second Edition,* John Wiley & Sons, 1976. pg. 654.

M. Kyoto, Y. Ohoga, S. Ishikawa, Y. Ishiguro, *Research and Development Group, Sumitomo Electric Industries Ltd,* 1993 Chapman and Hall, pp. 2738–2744.

I. H. Malitosn, *Interspecimen Comparison of the Refractive Index of Fused Silica,* Journal of the Optical Society of America, vol. 55, No. 10, pp. 1205–1209.

James A. McClay and Angela S.L. McIntyre, *157 nm optical lithography: The accomplishments and the challenges,* Solid State Technology, Jun. 1999, pp. 57–68.

Taro Moritani et al., *"Glass Engineering Handbook,"* Apr. 20, 1964, Asakura Shoten, p. 611, Clause 2.1 Fabrication.

Patent Abstracts of Japan, vol. 1996, No. 07, Jul 31, 1996, JP 08067530, Sumitomo Electric Ind Ltd., Mar. 12, 1996, Abstract.

Patent Abstracts of Japan, vol. 012, no 191 (C–501), Jun. 3 1988, JP 62–297233, Fujitsu Ltd., Dec. 24, 1987, Abstract.

Patent Abstracts of Japan, vol. 006, No. 252 (P–161), Dec. 10, 1982, JP 57–147604, Nippon Denki KK, Sep. 11, 1982, Abstract.

* cited by examiner

FIG. 1 VUV SPECTRA OF STANDARD UV EXCIMER GRADE SILICA (GLASS A), DRY FUSED SILICA (GLASS B) AND DRY FUSED SILICA CONTAINING 0.8 wt.% F (GLASS C).

FIG. 2  OPTICAL DENSITY AS A FUNCTION OF SAMPLE THICKNESS FOR GLASS C.

FIG. 3 ABSORPTION SPECTRA TAKEN BEFORE AND AFTER EXPOSURE TO $F_2$ LASER RADIATION COMPARING DRY SILICA WITHOUT F (GLASS B) AND A 0.2 wt.% F-DOPED, DRY SILICA (GLASS D). DATA IS FOR 1.1 mm THICK SAMPLES.

FIG. 4 REFRACTIVE INDEX AS A FUNCTION OF WAVELENGTH FOR GLASS E (0.8 wt.% F) SHOWING 3-TERM SELLMEIER FIT AND EXTRAPOLATION TO 157-nm.

FIG. 5   435.8-nm REFRACTIVE INDEX (MEASURED) AS A FUNCTION OF FLUORINE CONTENT.

FIG. 6  157-nm REFRACTIVE INDEX (CALCULATED FROM SELLMEIER FIT) AS A FUNCTION OF FLUORINE CONTENT.

FIG. 7 COEFFICIENT OF THERMAL EXPANSION AS A FUNCTION OF FLUORINE LEVEL.

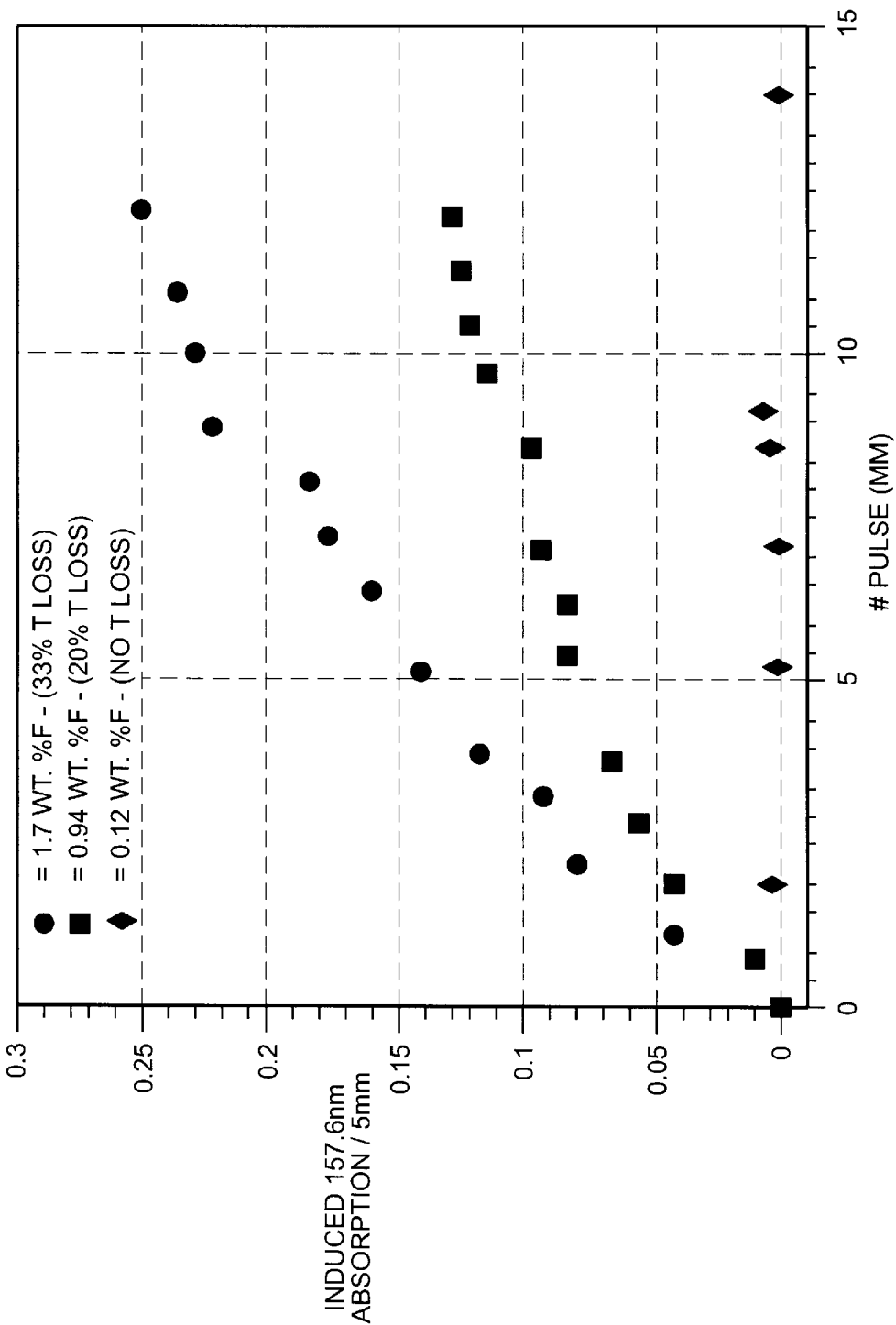
FIG. 12  $F_2$ EXCIMER LASER ( 2 mJ/cm$^2$-PULSE)

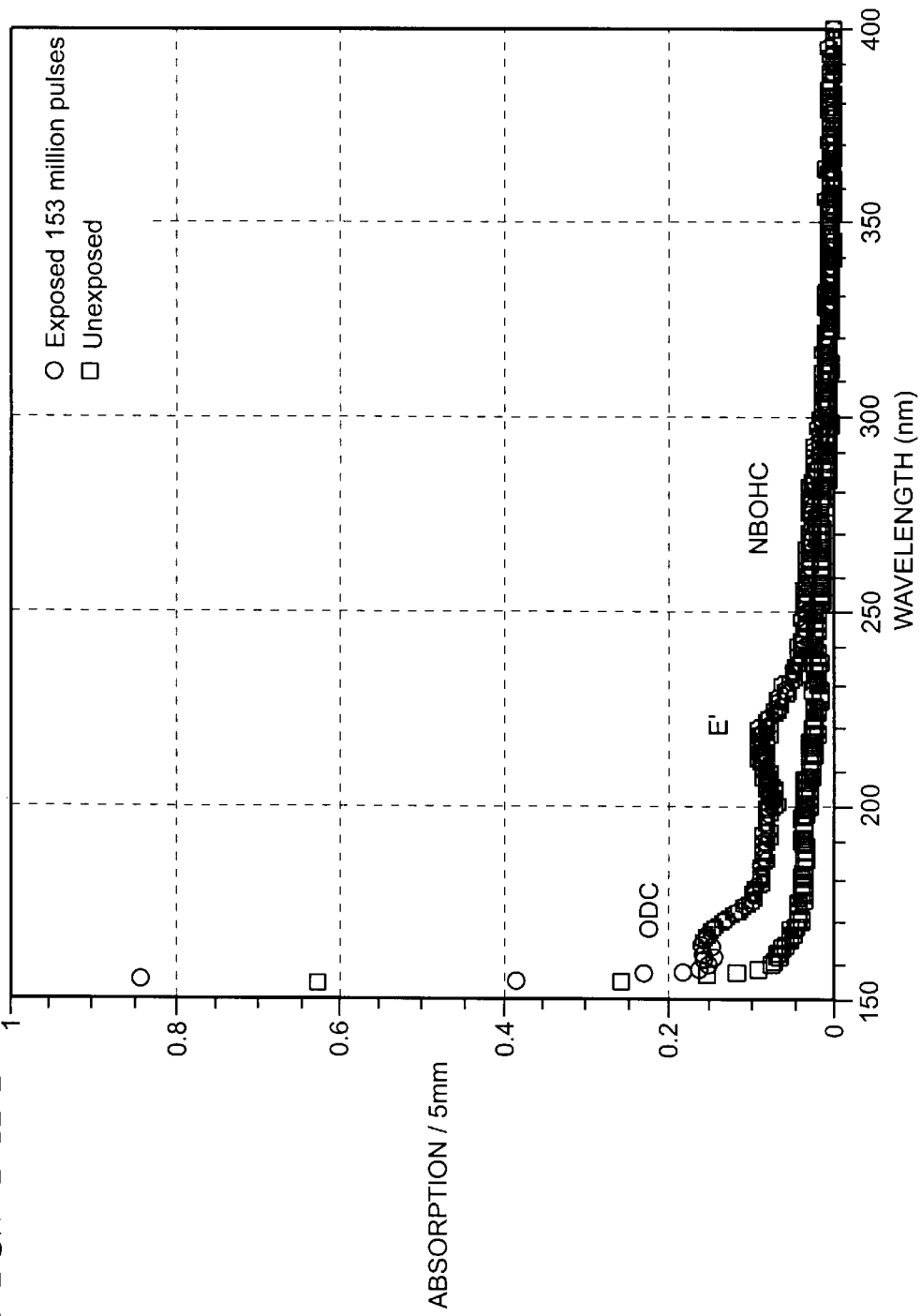

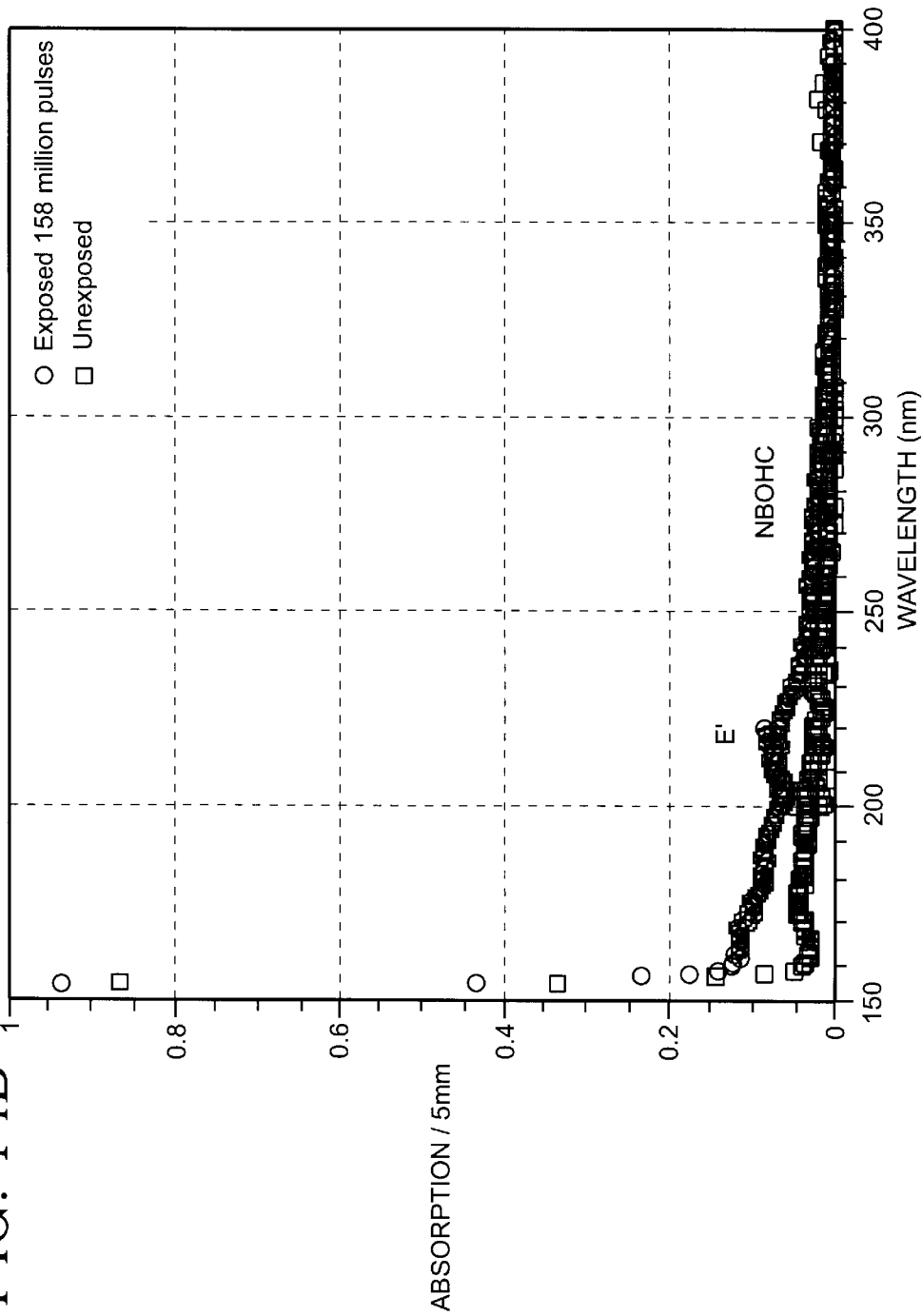

VACUUM ULTRAVIOLET TRASMITTING SILICON OXYFLUORIDE LITHOGRAPHY GLASS

CROSS-REFERENCE TO RELATED APPLICATIONS

The application is continuation-in-part to U.S. application Ser. No. 09/799,987, filed Mar. 6, 2001, now U.S. Pat. No. 6,492,072 entitled Vacuum Ultra-Violet Transmitting Silicon Oxyfluoride Lithoqraphy Glass, of Lisa A. Moore and Charlene Smith, which is a continuation Ser. No. 09/397, 573, U.S. Pat. No. 6,242,136 filed Sept. 16, 1999, which claims priority to U.S. Provisional Serial No. 60/135,270 filed May 21, 1999 and U.S. Provisional Serial No. 60/119, 805 filed Feb. 12, 1999, all of which benefit of priority is claimed.

FIELD OF THE INVENTION

The present invention relates generally to lithography, and particularly to optical photolithography glass for use in optical photolithography systems utilizing vacuum ultraviolet light (VUV) wavelengths below 193 nm, preferably below 175 nm, preferably below 164 nm, such as VUV projection lithography systems utilizing wavelengths in the 157 nm region.

The invention relates to VUV transmitting glass that is transmissive at wavelengths below 193 nm, in particular, a photomask silicon oxyfluoride glass suitable for use in the Vacuum Ultraviolet (VUV) 157 nm wavelength region.

BACKGROUND OF THE INVENTION

U.S. application Ser. No. 60/271,136, filed Feb. 24, 2001, entitled Vacuum Ultra-Violet Transmitting Silicon Oxyfluoride Lithography Glass, to Lisa A. Moore and Charlene Smith, to U.S. application Ser. No. 09/397,572, filed Sep. 16, 1999, entitled Projection Lithography Photomasks And Method Of Making, of George Berkey, Lisa A. Moore and Michelle D. Pierson, and U.S. application Ser. No. 09/397, 577 filed Sep. 16, 1999, entitled Projection Lithography Photomask Blanks, Preforms and Method of Making, of George Berkey, Lisa A. Moore and Charles C. Yu, are hereby incorporated by reference.

Refractive optics requires materials having high transmittance. For semi-conductor applications where smaller and smaller features are desired at the 248 and 193 nm wavelengths, high purity fused silica has been show to exhibit the required minimum transmittance of 99%/cm or better.

Projection optical photolithography systems that utilize the vacuum ultraviolet wavelengths of light below 193 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm and 193 nm wavelengths, but the commercial use and adoption of vacuum ultraviolet wavelengths below 193 nm, such as 157 nm has been hindered by the transmission nature of such vacuum ultraviolet wavelengths in the 157 nm region through optical materials. Such slow progression by the semiconductor industry of the use of VUV light below 175 nm such as 157 nm light has been also due to the lack of economically manufacturable photomask blanks from optically transmissive materials. For the benefit of vacuum ultraviolet photolithography in the 157 nm region such as the emission spectrum VUV window of a $F_2$ excimer laser to be utilized in the manufacturing of integrated circuits there is a need for mask blanks that have beneficial optical properties including good transmission below 164 nm and at 157 nm and that can be manufactured economically.

The present invention overcomes problems in the prior art and provides a economical high quality improved photomask blanks and VUV transmitting lithography glass that can be used to improve the manufacturing of integrated circuits with vacuum ultraviolet wavelengths.

Use of high purity fused silica as optical elements in photolithography stems from the fact that high purity fused silica is transparent over a wide range of wavelengths, spanning from the infrared to deep ultraviolet regions. Furthermore, high purity fused silica exhibits excellent chemical durability and dimensional stability. These properties have made high purity fused silica highly suited for use as optical lenses as well as for photomask substrates in photolithography, but use has been limited to the KrF and ArF wavelength regions.

Photomask glass qualifications are comparatively different from other optical elements used in photolithography in that they characteristically have smaller thicknesses of as low as only a few millimeters through the optical path. As such, they must meet very strict requirements for dimensional stability (warping and shrinkage) in order to ensure the extreme accuracy required to form fine circuit patterns on the photomask plate and target. And as the demand for even smaller features continues to drive the lasing wavelength further down to the 157 nm region and lower, the choice of optical materials meeting the minimum required transmittance becomes severely limited for all optical elements, but even more so for photomask substrates due to the reasons stated above. Crystalline materials such as calcium fluoride, barium fluoride and magnesium fluoride for example, have been shown to exhibit transmittances which are suitable for 157 nm wavelength applications. Unfortunately, these materials tend to have certain drawbacks making them unsuitable for these applications, in addition to manufacturing/economic problems. For example, calcium fluoride exhibits unacceptably high thermal expansion properties for photomask applications in the 157 nm wavelength region. Magnesium fluoride on the other hand, exhibits acceptable expansion but is unsuitable because it is naturally birefringment.

Accordingly, it is an object of the present invention to disclose VUV transmitting silicon oxyfluoride glasses for use at VUV wavelengths below 193 nm, preferably in the $F_2$ Excimer Laser 157 nm region, methods of making such glass, and methods for characterizing such silicon oxyfluoride glass.

SUMMARY OF THE INVENTION

In the present invention we disclose VUV transmitting silicon oxyfluoride lithography glass suitable for use as optical elements, for use as a lens or preferably for use as a photomask substrate at VUV wavelengths below 193 nm. In particular, the inventive silicon oxyfluoride glass exhibits certain properties tailored for applications in the photolithography VUV wavelength region around the 157 nm Excimer laser wavelengths and below 193 nm.

The object of the invention is achieved by use of a dry low hydroxy radical fluorine-doped $SiO_2$ fused synthetic silicon oxyfluoride glass which exhibits very high transmittance in the vacuum ultraviolet (VUV) wavelength region while exhibiting excellent thermal and physical properties. By "dry" we mean having an OH content below 50 ppm by weight, preferably dehydrated below 10 ppm OH by weight, and most preferably below 1 ppm by weight.

In another aspect, the object of the invention is further achieved by ensuring that the silicon oxyfluoride glass is essentially free of chlorine.

In yet another aspect, the object of the invention is achieved by ensuring a low molecular hydrogen content in the glass. By this we mean that the molecular hydrogen ($H_2$) content is below $1\times10^{17}$ molecules/cm$^3$.

In a preferred embodiment of the invention, the VUV transmitting silicon oxyfluoride glass has a fluorine content in the range of 0.1 to 0.4 weight percent which inhibits laser exposure induced absorption and provides laser exposure durability with minimal transmission loss at 157.6 nm after prolonged exposure. The invention includes a below 193 nm VUV transmitting glass photomask substrate for photolithography at wavelengths of about 157 run with the glass being a high purity silicon oxyfluoride glass with an OH content below 50 ppm by weight, hydrogen content below $1\times10^{17}$ molecules/cm$^3$ and a fluorine content in the 0.1 to 0.4 weight percent range. The invention includes a process of making VUV transmitting glass silicon oxyfluoride glass that includes providing particles of $SiO_2$, dehydrating the particles, and fluorine doping and consolidating the particles to form a dry, non-porous monolithic body of transparent fused silicon oxyfluoride glass with a fluorine content less than 0.5 weight percent. The invention includes a silicon oxyfluoride glass having essentially no OH groups, less than $5\times10^{16}$ molecules/cm$^3$ of molecular hydrogen, and a fluorine content in the range of 0.1 to 0.4 weight %. The invention includes a silicon oxyfluoride lithography glass having an OH content less than 5 ppm by weight, a Cl content less than 5 ppm by weight, a H2 content less than $1\times10^{17}$ molecules/cm$^3$, and a fluorine content of 0.1 to 0.4 weight % with a 157 nm internal transmission of at least 85%/cm. The invention includes a VUV pattern printing method with the steps of providing a below 164 nm radiation source for producing VUV photons, providing a silicon oxyfluoride glass having less than 5 ppm by weight OH, less than 5 ppm by weight Cl, a<0.5 weight percent fluorine content, and 157 nm and 165 nm measured transmission of at least 75%/5 mm. The pattern printing method includes transmitting the VUV photons through the silicon oxyfluoride glass, forming a pattern with the VUV photons and projecting the pattern onto a VUV radiation sensitive printing pattern. The invention includes a VUV transmitting silicon oxyfluoride glass having a OH content less than 5 ppm by weight, a fluorine content of at least 0.1 weight %, the glass consisting essentially of Si, O, and F with an internal transmission in the wavelength range of 157 nm to 175 nm of at least 85%/cm and a 165 nm absorption less than 0.4 (absorption units/5 mm) after exposure to a 157 nm laser for 41.5 million pulses at 2 mJ/cm$^2$-pulse.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

BRIEF DESCRIPTION OF DRAWINGS

FIG. 12 is a plot of induced 157 nm absorption of 5 mm thick samples vs. number of pulses (MM) of a $F_2$ Excimer Laser (2mJ/cm$^2$-pulse) in accordance with the invention.

FIG. 14A is an absorption spectra before and after ArF Excimer Laser Exposure (9 mJ/cm$^2$-pulse) (153 million pulses) of a high fluorine sample (<0.5 ppm OH by weight) with 1.7 wt. % F.

FIG. 14B is an absorption spectra before and after ArF Excimer Laser Exposure (9 mJ/cm$^2$-pulse) (158 million pulses) of a low fluorine sample (<0.5 ppm OH by weight) with 0.12 wt. % F.

DETAILED DESCRIPTION OF THE INVENTION

Figure 1:
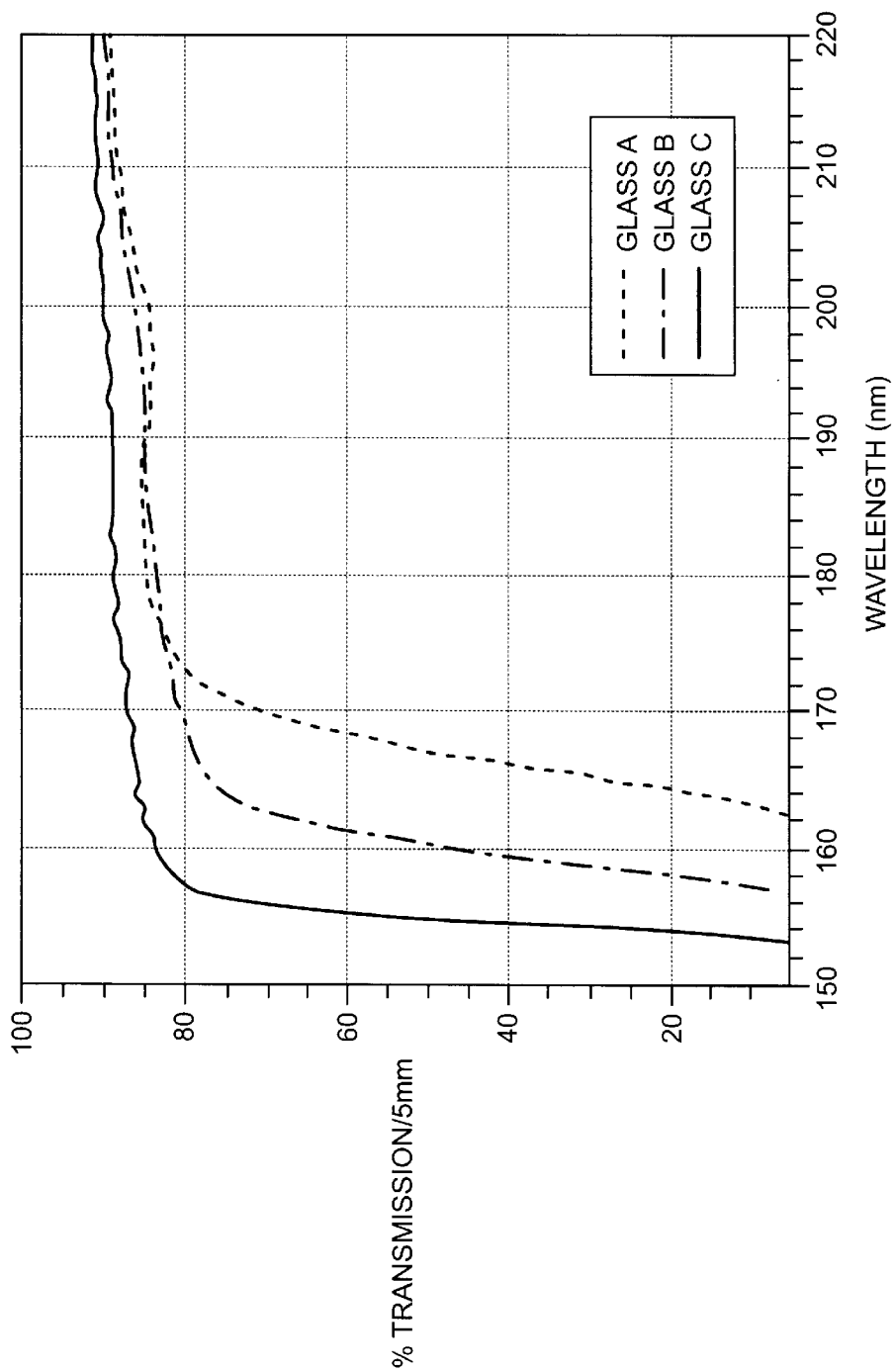
FIG. 1 is a VUV spectra comparison plot of % transmission vs. wavelength (nm) with glass C containing 0.8 wt. % F in accordance with the invention.

Reference will now be made in detail to the present preferred embodiments of the invention, examples of which are illustrated in the accompanying drawings.

We have shown that high transmission at below 190 nm, in particular below 175 run, and most preferably at the $F_2$ Excimer Laser wavelength output centered around 157 nm can be provided in $SiO_2$ containing silicon oxyfluoride glasses by minimizing the OH or water content of the glass. Specifically, we have demonstrated that low OH silicon low chlorine oxyfluoride glass exhibits high transmissivity while having beneficial chemical, physical and mechanical.

The transmission properties of glass in general are dependent on glass composition. In pure silica, it has been demonstrated that even trace levels (ppm or less) of metal contaminants can cause significant reductions in transmission in the ultraviolet region. With this as a backdrop, we have demonstrated that besides metal impurities, the most important variables for controlling the VUV transmission edge of silicon oxyfluoride glass include its water or OH content, as well as its chlorine content. Specifically, we have found that the lower the OH content, the better the transmission, while the higher the chlorine content, the lower the transmission in the VUV 157 nm region. In addition, we have found that the amount of molecular hydrogen in the glass has to be minimized. Most preferably the $SiO_2$ containing silicon oxyfluoride glass has at least 0.5 wt. % Fluorine. In an alternatively preferred embodiment the silicon oxyfluoride glass has a fluorine content in the range of 0.1 to 0.4 weight percent.

In a preferred embodiment measurements of the infrared transmission of glass at 2.7 microns is used to quantify the OH content of glass.

In the following table, we compare the physical and mechanical properties of the inventive low OH silicon oxyfluoride glass with those of a comparative fused silica high OH material.

The inventive silicon oxyfluoride glass may be manufactured by adaptation of a variety of methods such as by hydrolysis/pyrolysis (flame hydrolysis), thermal decomposition (soot process), and oxidation of silicon-containing compounds. Other methods include sol gel processes.

A. Silica-forming Processes

Soot Deposition or CVD Process: Typically, in this process the silicon-containing compound is heated to a constant temperature at which enough vapor pressure is generated to produce a reasonable rate of deposition. The vapors are entrained in a carrier gas stream and passed through a burner flame (e.g., natural gas/oxygen mixture, hydrogen/oxygen mixture) to convert the vapor into silica upon exiting the burner and to form a stream of volatile gases and finely-divided, amorphous, spherical aggregates (soot). In the Outside Vapor Deposition (OVD) variation of this process, the soot is collected on a mandrel that traverses through the flame to build up a porous silica soot pre-form body. In the Vapor Axial Deposition (VAD) variation, a porous soot pre-form body is built up by depositing soot on the end of a mandrel preferably with the deposition process vertically oriented to form a vertically oriented soot log. In either case, the porous silica pre-form is subjected to a subsequent high temperature treatment to consolidate the amorphous particles into a non-porous monolithic glassy fused silica body. In order to adapt the soot or CVD process to the present invention, in addition to consolidation, the amorphous $SiO_2$ soot particles are exposed to a fluorine atmosphere fluorine doping agent as more fully described below. Most preferably in addition to such fluorine doping of the $SiO_2$, the $SiO_2$ is dehydrated in order to eliminate OH groups associated with the $SiO_2$.

Dry, fluorine-doped silica can also be formed by casting high purity silica powder to form a porous silica preform, exposing the body to a fluorinating gas, and sintering the porous preform to form a monolithic fused silica body. High purity silica powders can be made by either a vapor phase method or by a sol gel method. The advantage of this method is that the soot can be cast and sintered into a desired shape, such as a plate. In a preferred embodiment the silica powder is a silicon oxyfluoride silica powder. Such casting of a silicon oxyfluoride silica powder can reduce the degree of exposure of the body to a fluorinating gas or may be used to replace the need to expose with fluorinating gas.

To ensure that the glass resulting from the above methods is essentially chlorine-free, the silica-containing starting material is preferably chlorine-free. Useful starting materials include silanes and siloxanes, in particular polymethylsiloanes such as polymethylcyclosiloxane, and hexamethyldisiloxane. Useful polymethylcyclosiloxanes include octamethylcyclotetrasiloxane, decamethylcyclopentasiloxane, hexamethylcylotrisiloxane and mixtures of these. Another useful chlorine-free feedstock for making chlorine-free fused silica includes methyltrimethoxysilane. If chlorine containing feedstocks and/or chlorine gas agents are utilized, subsequent production processes should be controlled to minimize chlorine in the produced glass and subsequent process steps such as fluorine doping with fluorine atomspheres should be controlled and include sufficient chlorine removing agents such as sufficient levels of fluorine doping agents and helium, and sufficient reaction times/dynamics to eliminate chlorine.

Since fluorine is a desirable component of the inventive fused silica, fluorine-containing starting materials such as silicon fluoride, silicon tetrafluoride and mixtures of these, may be used in the above methods. In addition to utilizing silicon fluoride starting materials, fluorine source starting materials such as $CF_4$ and $C_2F_6$ can be used along with silicon-containing starting material compounds in combustion/oxidation process reacting to produce fluorine doped silica such as silicon fluoride silica soots and powders.

B. Dehydration and Fluorine Doping Process

In order to form dry $SiO_2$ (i.e., $SiO_2$ having little or no OH groups) according to the present invention, the pre-consolidated pre-form bodies formed by the above methods are exposed to a dehydrating gas agent preferably a halogen-containing atmosphere at elevated temperatures, then sintered to a monolithic fused silica body at even higher temperatures. In an embodiment the dehydration process involves heating the porous silica pre-form in a He/dehydrating gas agent atmosphere (such as helium/halide, helium/$Cl_2$) at a temperature between 1000 and 1100° C., to remove water from the silica soot, then sintering the pre-form by passing it through a high temperature zone (typically 1450–1500° C.) to form a non-porous, monolithic dry fused silica body. To produce a fluorine-doped glass, preferably, after the dehydration step the soot pre-form is exposed to an atmosphere of He and a fluorine-containing gas, such as $CF_4$, $SiF_4$, $SF_6$, $F_2$, $C_2F_6$, $C_3F_8$ and mixtures of these, at temperatures in the range of 1150 to 1250° C. Even though the fluorine doping step can be done either before, during or after the dehydration step, it is preferable to do the fluorine doping after a chlorine drying step because this allows the fluorine to displace any chlorine which may be present in the glass, and provide a glass in which chlorine has been eliminated. Also, since the fluorine doping is typically done at a higher temperature than the dehydration step there is a tendency for the glass to sinter and "trap" the fluorine. Further, if the fluorine doping is done before or during the dehydration step some of the fluorine will tend to outgas from the blank at the lower drying temperature. In such a process the blank will also contain more residual and detrimental chlorine. Finally, by fluorinating after the dehydration step there is an added benefit since the fluorinating gas itself tends to further dry the blank. Additionally fluorine levels can be improved by utilizing silicon oxyfluoride silica particles in the making of the pourous preform. Such silicon oxyfluoride silica particles are preferably achieved by combusting the silicon feedstock (such as $SiCl_4$ or OMCTS) along with a fluorine source (such as $CF_4$ or $C_2F_6$). Additionally the fluorine doping process can be improved by retaining a large level of flourine in the porous preform prior to and during consolidation/sintering into a non-porous body. Such retention can be improved by forming a non-porous exterior layer on the porous preform body (such as high temperature radiation thermal treatment focussed on the exterior surface) and inputting the fluorine containing gas into the interior of the porous preform such that the non-porous exterior layer forms an exterior shell barrier for controlling the escape of fluorine from the porous preform body. In an embodiment the exterior surface of the porous preform body is sintered to form a non-porous shell and fluorine is inputted into the porous body.

While we have described the preferred process as involving both a drying and a fluorinating step, in an embodiment of the invention we have found that high transmittance fused silica suitable for below 193-nm wavelength can also be made by fluorine doping with no prior drying step.

The amount of fluorine incorporated in the glass ([F]) is controlled by the partial pressure of the fluorine-containing gas (P) and the temperature (T) according to the relationship:

$$[F]=C \times e^{-E/RT} \times P^{1/4}$$

where C is a constant, R is the gas constant, and E is the activation energy for the reaction between the fluorine-containing gas and silica, for example:

$$CF_4+4SiO_2=4SiO_{1.5}F+CO_2,$$

$$SiF_4+3SiO_2=4SiO_{1.5}F.$$

The dry fluorine doped soot pre-form is then sintered by passing it through a high temperature zone (typically 1450–1500° C.) to form a non-porous, monolithic dry silicon oxyfluoride $SiO_2$ glass body as described earlier. The atmosphere around the pre-form during the sintering step may be He or a He/fluorine-containing gas mixture, but preferably does not contain chlorine in order to minimize incorporation of chlorine into the $SiO_2$ glass. The amount of fluorine in the fused silica is preferably not below 1000 ppm, more preferably 2000 ppm or greater. In a preferred embodiment fluorine content is in the range of 0.1 to 0.4 weight percent.

In addition to being preferably free of OH groups, being fluorine-doped and essentially free of chlorine, we have found that the inventive fused silica photomask blank is also preferably low in molecular hydrogen, preferably less than $1 \times 10^{17}$ molecules/$cm^3$, and more preferably less than $5 \times 10^{16}$ molecules/$cm^3$ of molecular hydrogen.

A low OH (OH content<1 ppm) modified fused $SiO_2$ silicon oxyfluoride glass photomask substrate was doped with 0.8 wt % fluorine and had a lowered thermal expansion of 0.52 ppm/° C. and an internal transmittance of about 84%/cm at 157 nm.

Reducing the OH content to less than 50 ppm, preferably less than 10 ppm, and most preferably less than 1 ppm and doping the silica glass with fluorine provides for increased transmission at 157 nm and in lowered thermal expansion. The preferred 157 nm transmission photolithography fluorine doped low OH fused $SiO_2$ glass photomask substrate has a transmittance of at least 80%, preferably at least about 83%/cm at 157 nm, and a thermal expansion less than 0.55 ppm/° C., preferably less than 0.53 ppm/° C.

The photomask substrate was made by forming a silica soot preform. The silica soot preform was formed by depositing silica soot produced by converting silicon tetrachloride (silica feedstock) into $SiO_2$. Siloxane silica feedstocks, preferably cyclic siloxanes, and most preferably octamethylcyclotetrasiloxane can be converted into $SiO_2$. Preferably such conversion of silica feedstocks is achieved by passing the feedstock through the conversion site flame of a conversion site burner.

The invention further includes a below 175 nm VUV lithography glass. The lithography glass comprises a fused silicon oxyfluoride glass. The silicon oxyfluoride glass has an OH content less than 5 ppm by weight, a Cl content less than 5 ppm by weight, a $H_2$ content less than $1 \times 10^{17}$ molecules/$cm^3$, and a fluorine content of at least 0.1% weight %, with said glass having a 157 nm internal transmission of at least 80%/cm and preferably at least 85%/cm. The silicon oxyfluoride glass has a below fused silica coefficient of thermal expansion that is less than 0.55 ppm/° C. in the room temperature to 300° C. range. Preferably the lithography glass has an internal transmission in the wavelength range of 157 nm to 175 nm of at least 80%/cm, and more preferably at least 85%/cm. Preferably the silicon oxyfluoride lithography glass has an increase of absorption at 215 nm of less than 0.1 optical density ($log_{10}$ transmission) per mm when exposed to at least $0.96 \times 10^6$ pulses of 157 nm wavelength containing $F_2$ excimer laser radiation at 4 m J/$cm^2$-pulse, and more preferably the increase of absorption at 215 nm is less than 0.05 optical density, and most preferably substantially no 215 nm absorption band is formed. Preferably the Cl content of the glass is less than 1 ppm and the OH content is less than 1 ppm, and more preferably the glass consists essentially of Si, O, and F. Preferably the glass is essentially free of metal to metal Si—Si bonds, and the glass is free of a 165 nm absorbing center with an internal transmission at 165 nm of at least 85%/cm.

Figure 8:
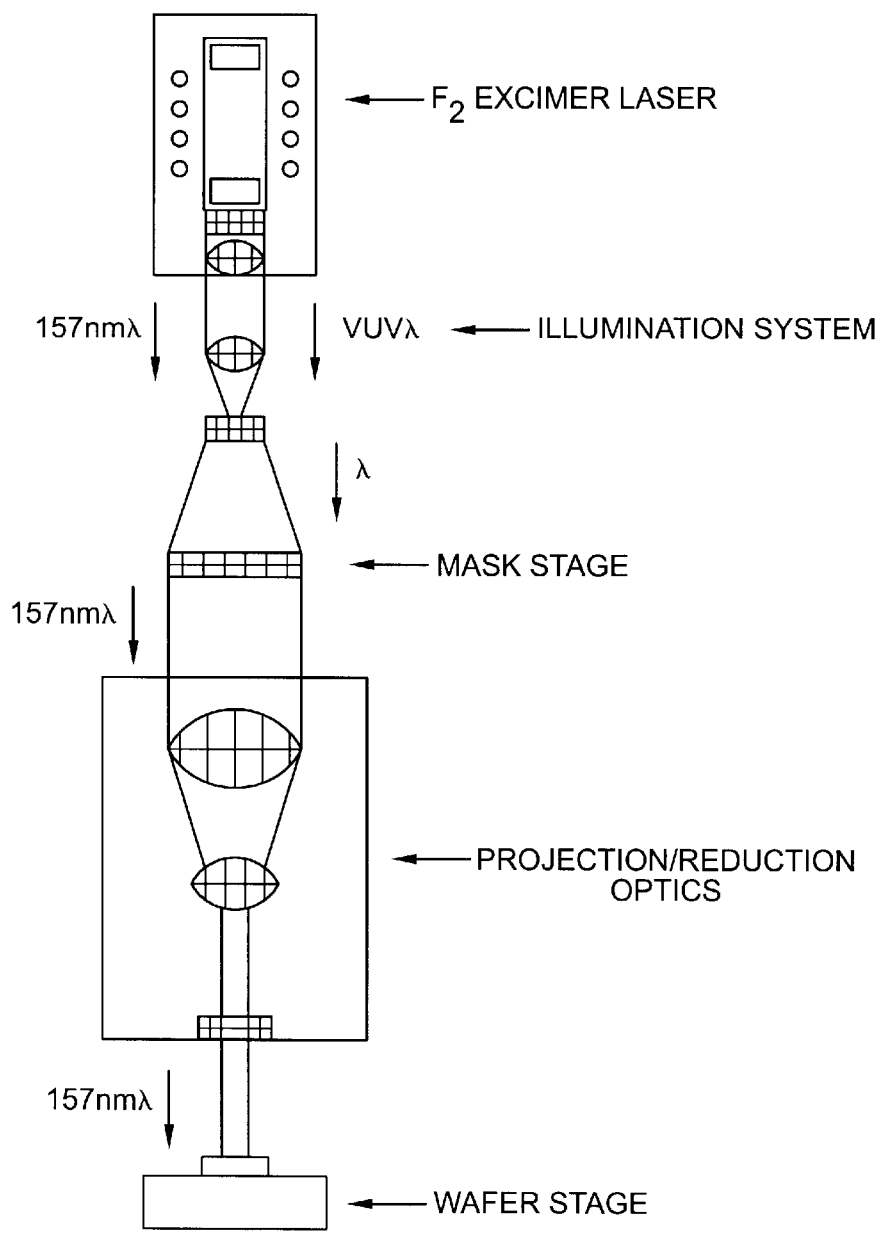
FIG. 8 shows a method/lithography system in accordance with the invention.
Figure 9:
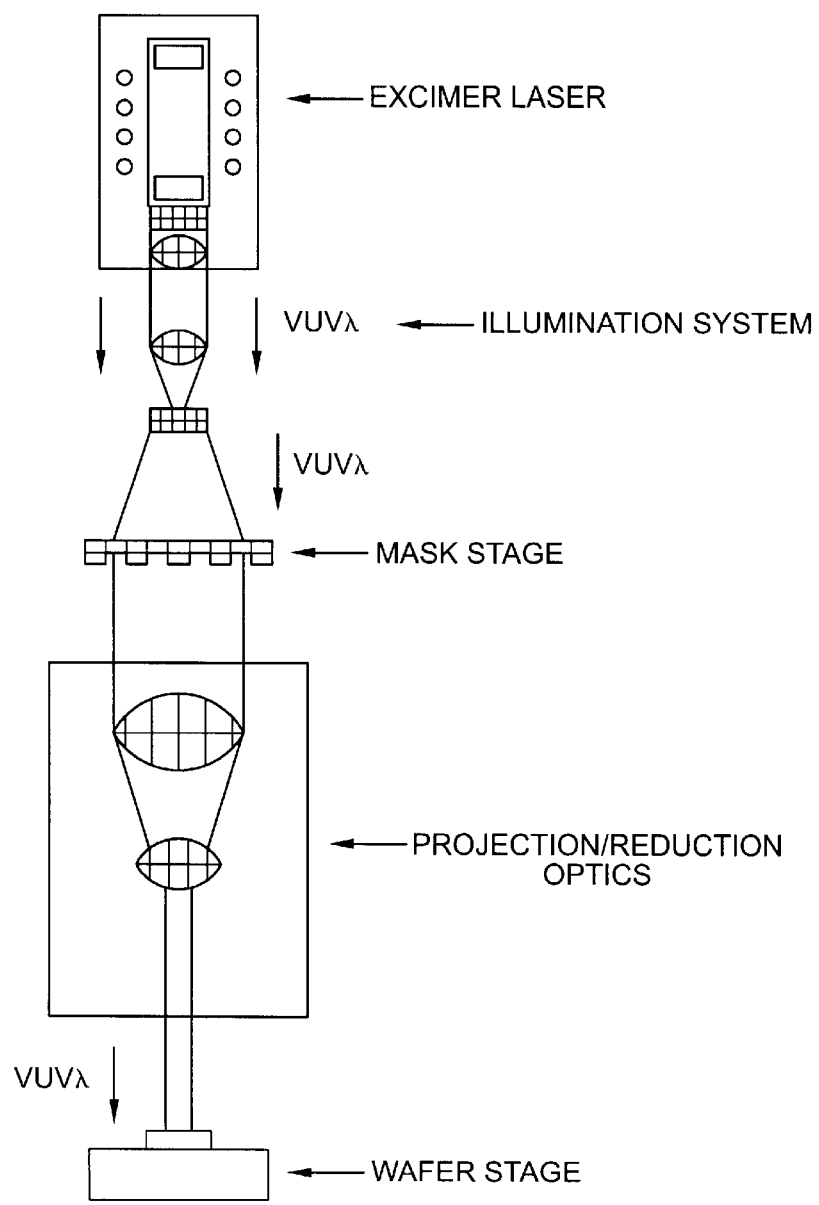
FIG. 9 shows a method/lithography system in accordance with the invention.
Figure 10:
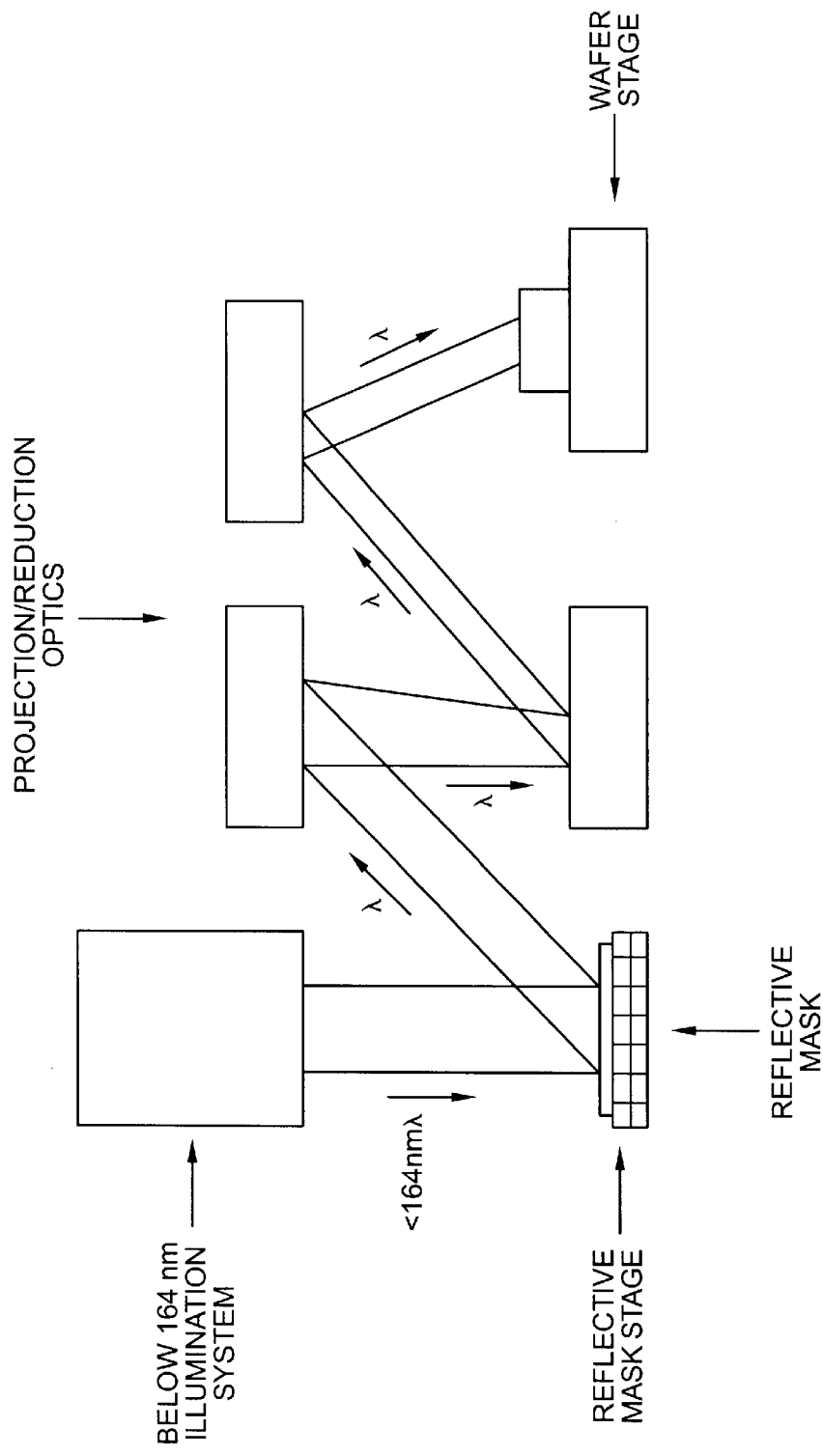
FIG. 10 shows a method /lithography system in accordance with the invention.

In a preferred embodiment the lithography glass is used to make a VUV transmitting photomask where VUV light is transmitted through the photomask, preferably with a surface of the lithography glass having a patterned deposited film (such as Cr) that forms a transmitting photolithography mask pattern (FIG. 8). In a further embodiment the lithography glass is used to make a VUV phase shifting photomask where the phase of VUV lithography light traveling through the glass is shifted and manipulated to form constructive and/or destructive interference patterns (FIG. 9). In a further embodiment the lithography glass with a lowered thermal expansion and a thermal expansion coefficient less than 0.55 ppm/° C. is used to make a reflective photomask wherein a reflective patterned lithography mask pattern is supported by said silicon oxyfluoride glass (FIG. 10).

The invention further includes a pattern printing method of VUV lithography which includes providing a below 164 nm radiation source for producing VUV lithography photons, providing a silicon oxyfluoride lithography glass having less than 5 ppm by weight OH, less than 5 ppm by weight Cl, and 157 nm and 165 nm measured transmission of at least 75%/5 mm, transmitting the VUV lithography photons through the provided silicon oxyfluoride lithography glass, forming a lithography pattern with the photons, and reducing the formed lithography pattern and projecting the formed pattern onto a VUV radiation sensitive lithography printing medium to form a printed lithography pattern (FIG. 8). Providing the oxyfluoride lithography glass preferably includes lowering the VUV cutoff wavelength of the glass by providing an $SiO_2$ glass forming precursor, lowering the $H_2$, the OH, and the Cl content of the glass precursor and increasing the F content of the glass precursor to provide a silicon oxyfluoride glass with a 50% transmission VUV cutoff wavelength below 160 nm. Preferably the provided glass consists essentially of Si, O, and F and is essentially free of Si—Si bonds.

The invention as shown in FIG. 8 provides a 157 nm photolithography photomask substrate photomask stage and a 157 nm photolithography device (157 nm illumination system, photomask—mask stage, 157 nm projection optics system, 157 nm wafer stage) with such a fluorine doped low OH silicon oxyfluoride photomask silica glass substrate that has an OH content less than 1 ppm, a fluorine content in the range from 0.1 to 1.5 wt. %, 157 nm internal transmittances of at least 50%, and preferably at least 65%, and most preferably at least 83%/cm at 157 nm, and preferably a thermal expansion less than 0.55 ppm, preferably less than 0.53 ppm, and most preferably less than or equal to 0.52 ppm/° C.

EXAMPLE 1

A 1209 gram, 70 cm long porous silica preform was made by the OVD method using $SiCl_4$ as the feedstock. The soot preform was dehydrated in a furnace at 1000 C. for 60 minutes in an atmosphere of 0.066 slpm $Cl_2$ and 40.64 slpm He. The atmosphere was changed to 40 slpm He and the furnace temperature ramped to 1100 C. over 20 minutes. The atmosphere was changed to 0.4 slpm $CF_4$ and 40 slpm He and the soot preform was held at 1100 C. for 120 minutes. The atmosphere was then changed to 40 slpm He and the soot preform was translated at a rate of 0.5 cm/min into the bottom zone of the furnace which was held at 1480 C. in order to sinter it to a fully dense glassy body. A 5 mm thick sample was cut from the glass preform and polished. The average F concentration of the sample was determined by microprobe analysis to be 0.17 wt. % (1700 ppm wt.). The average Cl concentration was determined by microprobe analysis to be 0.0011 wt. % (11 ppm wt.). The OH content was measured by FTIR method to be below detection limit (<1 ppm). A transmission of 67.2%/5 mm at 157 nm was measured using a vacuum UV spectrophotometer.

EXAMPLE 2

A 1004 gram, 70 cm long porous silica preform was made by the OVD method using $SiCl_4$ as the feedstock. The soot preform was dehydrated in a furnace at 1000 C. for 60 minutes in an atmosphere of 0.066 slpm $Cl_2$ and 40.64 slpm He. The atmosphere was changed to 40 slpm He and the furnace temperature ramped to 1225 C. over 45 minutes. The atmosphere was changed to 0.8 slpm $CF_4$ and 39.2 slpm He and the soot preform was held at 1225 C. for 120 minutes. The soot preform was then translated at a rate of 0.5 cm/min into the bottom zone of the furnace which was held at 1480 C. under the same atmosphere in order to sinter it to a fully dense glassy body. A 5 mm thick sample was cut from the glass preform and polished. The average F concentration of the sample was determined by microprobe analysis to be 0.80 wt. % (8000 ppm wt.). The average Cl concentration was determined by microprobe analysis to be 0.0010 wt. % (10 ppm wt.). The OH content was measured by FTIR method to be below detection limit (<1 ppm). A transmission of 76.8%/5 mm at 157 nm was measured using a vacuum UV spectrophotometer.

EXAMPLE 3

A 1016 gram, 70 cm long porous silica preform was made by the OVD method using $SiCl_4$ as the feedstock. The soot preform was dehydrated in a furnace at 1000 C. for 60 minutes in an atmosphere of 0.066 slpm $Cl_2$ and 20.64 slpm He. The atmosphere was changed to 16 slpm He and the furnace temperature ramped to 1225 C. over 45 minutes. The atmosphere was changed to 4 slpm $CF_4$ and 12 slpm He and the soot preform was held at 1225 C. for 180 minutes. The soot preform was then translated at a rate of 0.5 cm/min into the bottom zone of the furnace which was held at 1480 C. under the same atmosphere in order to sinter it to a fully dense glassy body. A 5 mm thick sample was cut from the glass preform and polished. The average F concentration of the sample was determined by microprobe analysis to be 1.48 wt. % (14800 ppm wt.). The average Cl concentration was determined by microprobe analysis to be 0.0020 wt. % (20 ppm wt.). The OH content was measured by FTIR method to be below detection limit (<1 ppm). A transmission of 73.5%/5 mm at 157 nm was measured using a vacuum UV spectrophotometer.

EXAMPLE 4

A 1000 gram, 50 cm long porous silica preform was made by the OVD method using octamethylcyclotetrasiloxane as the feedstock. The soot preform was placed in a furnace at 1000 C. in an atmosphere of 40 slpm He. The furnace temperature was ramped to 1225 C. over 45 minutes. The atmosphere was then changed to 0.8 slpm $CF_4$ and 39.2 slpm He and the soot preform was held at 1225 C. for 120 minutes. The soot preform was then translated at a rate of 0.5 cm/min into the bottom zone of the furnace which was held at 1480 C. under the same atmosphere in order to sinter it to a fully dense glassy body. A 5 mm thick sample was cut from the glass preform and polished. The average F concentration of the sample was determined by microprobe analysis to be 0.96 wt. % (9600 ppm wt.). The average Cl concentration was determined by microprobe analysis to be <0.0010 (<10 ppm wt.). The OH content was measured by FTIR method to be below detection limit (<1 ppm). A transmission of 76.8%/5 mm at 157 nm was measured using a vacuum UV spectrophotometer.

EXAMPLE 5

A 3129 gram, 50 cm long porous silica preform was made by the OVD method using $SiCl_4$ as the feedstock. The soot preform was dehydrated in a furnace at 1100 C. for 120 minutes in an atmosphere of 0.4 slpm $Cl_2$ and 40 slpm He. The atmosphere was changed to 40 slpm He and the furnace temperature ramped to 1150 C. over 20 minutes. The atmosphere was changed to 2 slpm O2 and 20 slpm He and the temperature increased to 1200 C. over an additional 20 minutes. The atmosphere was changed to 1.2 slpm $SiF_4$, 18.8 slpm He, and 0.2 slpm O2 and the soot preform was held at 1200 C. for 180 minutes. The soot preform was then translated at a rate of 0.5 cm/min into the bottom zone of the furnace which was held at 1480 C. under the same atmosphere in order to sinter it to a fully dense glassy body. A 5 mm thick sample was cut from the glass preform and polished. The average F concentration of the sample was determined by microprobe analysis to be 1.29 wt. % (12900 ppm wt.). The average Cl concentration was determined by microprobe analysis to be <0.0010 wt. % (<10 ppm wt.). The OH content was measured by FTIR method to be below detection limit (<1 ppm). A transmission of 74.9%/5 mm at 157 nm was measured using a vacuum UV spectrophotometer.

Comparative Example 1

A sample of commercial Corning HPFS® brand UV excimer grade high-purity fused silica (Corning, Incorporated, Corning, N.Y., 14831) was obtained. The glass contained no fluorine, no chlorine, 800 ppm OH, and an $H_2$ content>$1 \times 10^{17}$ molecules/$cm^3$. A 5 mm thick sample had no transmission at 157 nm.

Comparative Example 2

A 2788 gram, 70 cm long porous silica preform was made by the OVD method using $SiCl_4$ as the feedstock. The soot preform was dehydrated in a furnace at 1000 C. for 50 minutes in an atmosphere of 0.066 slpm $Cl_2$ and 40.64 slpm He. The soot preform was then translated at a rate of 0.5 cm/min into the bottom zone of the furnace which was held at 1480 C. under the same atmosphere in order to sinter it to a fully dense glassy body. A 5 mm thick sample was cut from the glass preform and polished. The sample contained no fluorine. The average Cl concentration was determined by microprobe analysis to be 0.176 wt. % (1760 ppm wt.). The OH content was measured by FTIR method to be below detection limit (<1 ppm). A transmission of 21.2%/5 mm at 157 nm was measured using a vacuum UV spectrophotometer.

In a further example a $SiO_2$ soot preform was dehydrated (—OH removed) using a drying treatment atmosphere containing chlorine. Preferably the drying treatment atmosphere includes Helium in addition to the chlorine source molecules. Drying treatment atmospheres containing halides can be used to dehydrate the soot and remove —OH. Drying treatment atmospheres containing fluorine and/or bromine and/or other halides can be used, preferably with helium.

The $SiO_2$ soot preform was fluorine doped using a doping treatment atmosphere of $CF_4$ and helium. Silicon fluoride can also be used as a fluorine source in doping the silica with fluorine. Preferably fluorine doping is done after dehydrating the soot.

The $SiO_2$ soot preform was consolidated in a sintering treatment atmosphere of the $CF_4$ and helium. Silicon fluoride ($SiF_4$) can also be used as a fluorine source along with helium as the consolidating atmosphere.

A photomask substrate was formed from the resulting silicon oxyfluoride glass by cutting the glass, polishing the glass and exposing to 157 nm laser radiation.

The invention includes silicon oxyfluoride modified fused silica glasses with low OH contents and low levels of fluorine with measured transmissions of 73.8%/6.4 mm and internal transmittances of 87.9%/cm at 157-nm. From extrapolated refractive index measurements of samples, we calculate a theoretical limit for the measured transmission (reflection losses only) of about 88% at 157-nm. The glass has shown to have high resistance to laser-induced color center formation. The thermal expansion and Young's Modulus of the glass are lower than that of commercially available Corning HPFS brand® fused silica glass, while thermal conductivity is similar. Silicon oxyfluoride glass photomask substrates of the invention have been shown to behave similarly to standard fused silica substrates in mask-making processes such as polishing and Cr film deposition.

Low OH silica and fluorine-doped, low OH silica samples were prepared by a two-step soot consolidation process. Soot preforms were made by a flame deposition method then dried, fluorine-doped, and sintered in a high temperature furnace. High OH fused silica samples were Corning HPFS® which were prepared by a one-step flame hydrolysis process. OH levels of the glasses described here were quantified by measuring the fundamental OH stretching vibration using infrared spectroscopy. Fluorine levels were measured by microprobe analysis.

The silicon oxyfluoride glass substrates used in the mask processing studies were cut and polished. Cleaning and Cr film deposition were performed in accordance with photomask industry practice.

Transmission data were recorded on an Acton model VTMS-502 Vacuum Transmittance Measurement System. The dispersive and detector components consisted of a focused deuterium light source, a single monochromator with adjustable entrance and exit slits, and a detector interface that utilizes a photomultiplier tube. VUV transmittance measurements were made under vacuum.

For the 157-nm exposures, a TuiLaser ExciStar S200 $F_2$ laser was used. The energy through the aperture was monitored using a Molectron thermal detector. Vacuum UV and UV measurements were made after exposure.

Refractive index measurements were made on prisms. Index measurements at visible wavelengths (643.8-nm, 589.3-nm, 546.1-nm, 480.0-nm, and 435.8-nm) were made on a Bausch and Lomb low range refractometer with sodium and Hg-Cd emission lamps. A refractive index standard, certified by the National Institute of Standards and Technology (NIST), was measured along with the samples and used to correct the sample readings. Refractive index measurements at near IR wavelengths (777-nm, 1300-nm, and 1541-nm) were made on a Metricon Model 2010 Prism Coupler with laser diode sources. The accuracy of the visible and near IR measurements is estimated as ±0.0001.

FIG. 1 compares the VUV transmission spectra of Corning HPFS® UV excimer grade fused silica, (Glass A), dry silica containing no fluorine (Glass B), and the inventive silicon oxyfluoride glass dry silica containing 0.94 wt. % fluorine (Glass C). Glass A contained about 860 ppm wt. OH, while the OH contents of Glasses B and C were below the detection limit of the measurement (<1 ppm wt.). All of the samples were 5-mm thick and did not receive any special surface cleaning before the measurement. Glass A does not transmit at 157-nm. In Glass B the UV absorption edge is shifted to shorter wavelengths and the glass shows some transmission at 157-nm. In Glass C the UV absorption edge is shifted to even shorter wavelengths and the glass exhibits significant transmission at 157-nm, 79%/5 mm.

Figure 2:
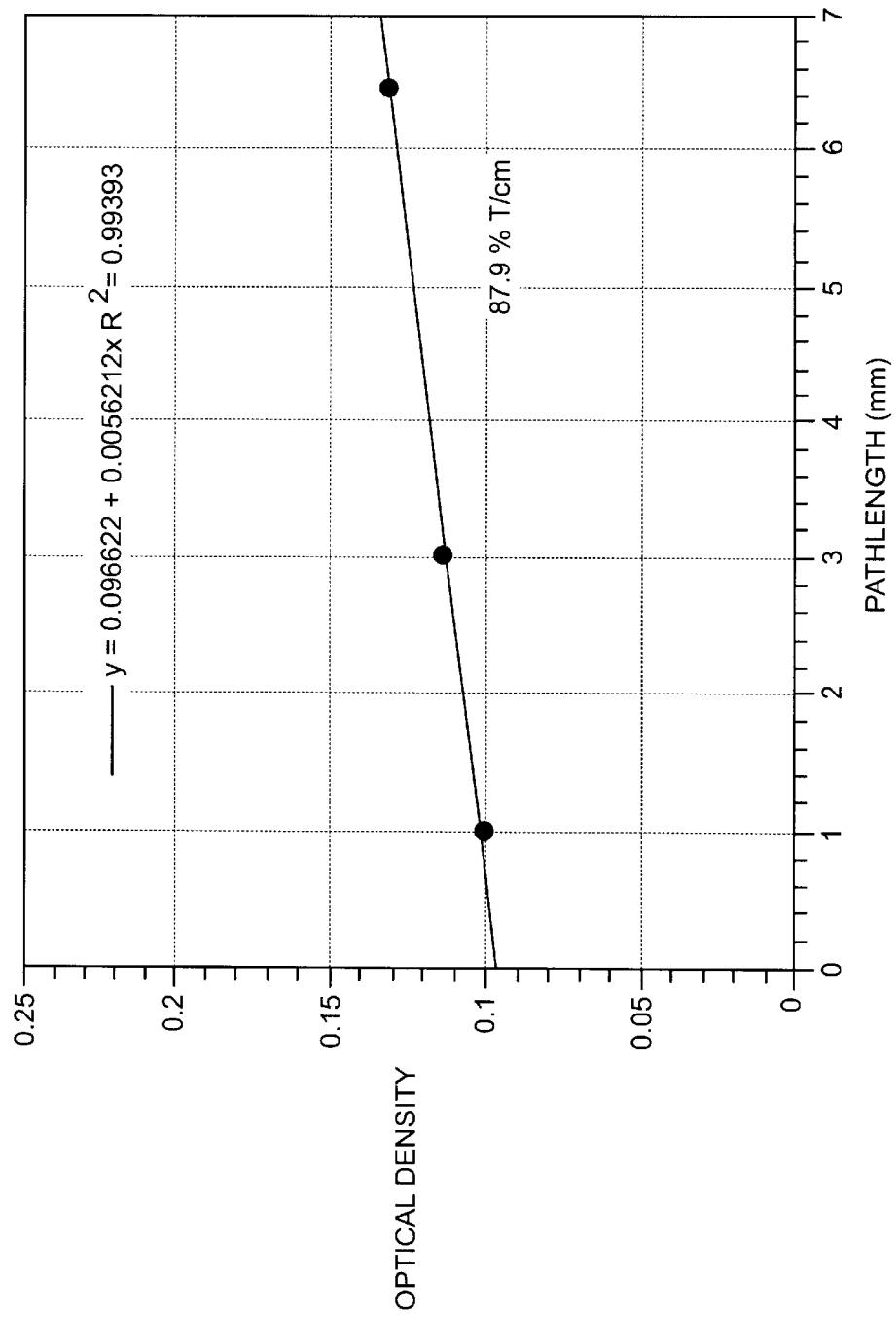
FIG. 2 is an optical density plot of optical density vs. pathlength sample thickness for 0.8 wt. % F glass C (mm) in accordance with the invention.

The internal transmittance at 157-nm of Glass C was determined by plotting the measured optical density at 157-nm vs. thickness for three different pathlengths (FIG. 2). The data were measured on optically polished samples with 5 angstrom RA surfaces. The slope of the line yields the absorption coefficient, which is a measure of the internal transmittance of the material. The "zero-thickness" intercept of the line is a measure of surface losses due to reflections, surface scattering, and surface contamination. The internal transmittance of the glass, calculated from the slope of the line, was found to be 87.9%/cm. The measured 157-nm transmission of Glass C, which includes internal and surface losses, was 73.8%/6.4 mm. From the intercept, it is calculated that 20% of the 26.2% measured losses are due to surface losses, which are highly dependent on sample surface preparation and cleaning, and, therefore, only 6.2% are due to internal loss mechanisms within the glass.

Internal loss mechanisms are scattering and absorption within the material. To separate the two mechanisms, we have made scattering measurements on the silicon oxyfluoride glass at wavelengths down to 193-nm. Measurements of scattered intensity were made on samples of silicon oxyfluoride glass and Corning HPFS® using a 193-nm laser, vertically polarized, at a 90° scattering angle. The ratio of the measured intensities was near unity. The scattering loss at 193-nm of Corning HPFS® had previously been determined to be 0.15%/cm. Using a $\lambda^{-4}$ extrapolation to 157-nm provides an estimate of about 0.34%/cm scattering loss. This is a very small loss compared to the internal losses of 12.1%/cm measured in Glass C. Therefore, the primary loss mechanism in Glass C is most likely absorption.

Figure 3:
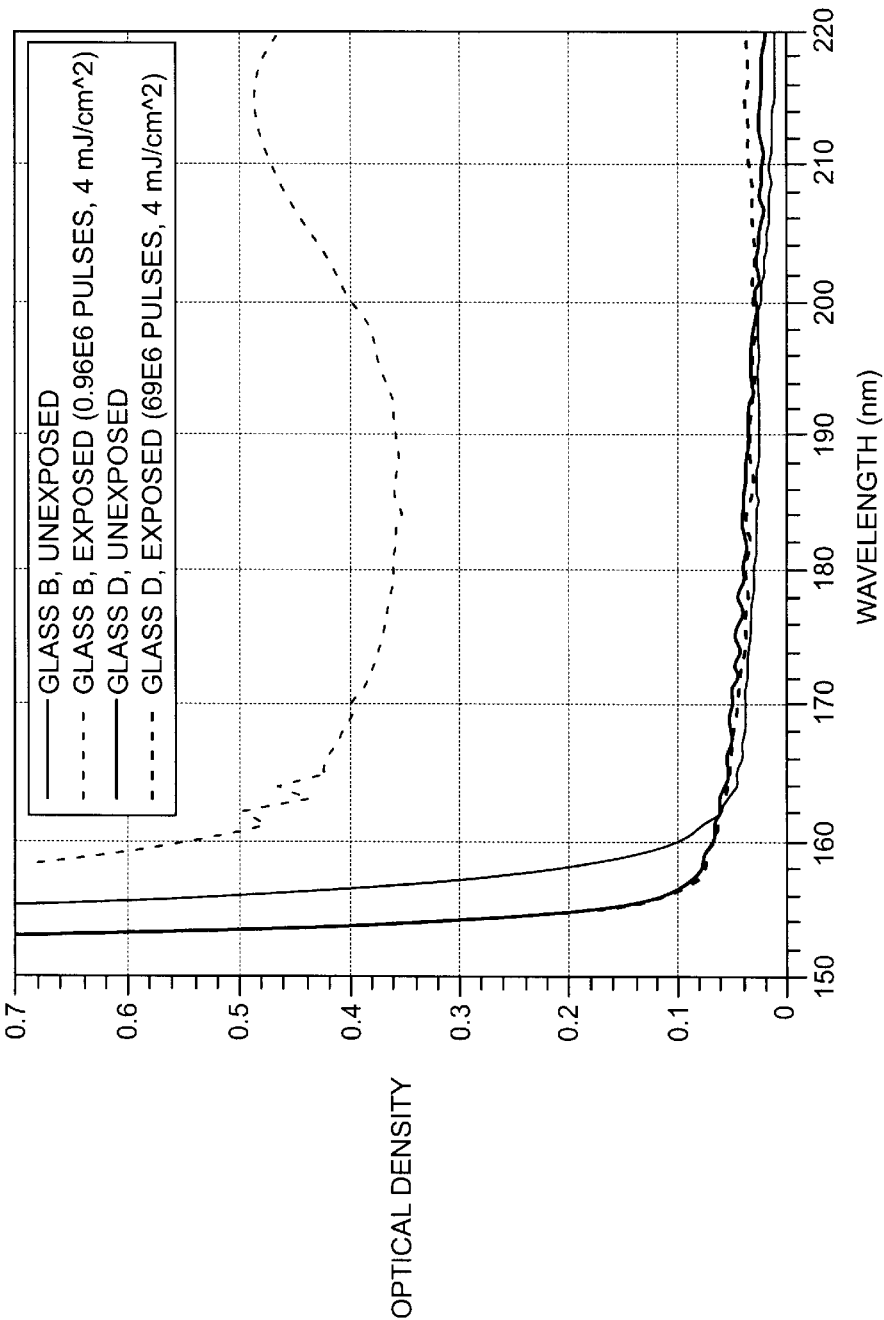
FIG. 3 is a before/after $F_2$ laser radiation exposure absorption spectral plot of optical density vs. wavelength (nm) for 1.1 mm thick samples with glass B having 0% F and glass D having 0.2 wt. % F in accordance with the invention.

FIG. 3 compares the absorption spectra of Glass B and an inventive silicon oxyfluoride Glass D (0.2 wt. % F) before and after exposure to $F_2$ radiation. All of the spectra have been normalized to 100% transmission at 400-nm. Glass B was given an exposure of $0.96\times10^6$ pulses at 4 mJ/cm²-pulse. The VUV measurement showed a significant increase in absorption over the entire wavelength range, 155–220 nm, and formation of the 215-nm band (E' centers). Glass D was given a much higher exposure of $69\times10^6$ pulses at 4 mJ/cm²-pulse, yet the glass exhibited a much smaller increase in absorption and the 215-nm band is not substantially detectable.

Figure 4:
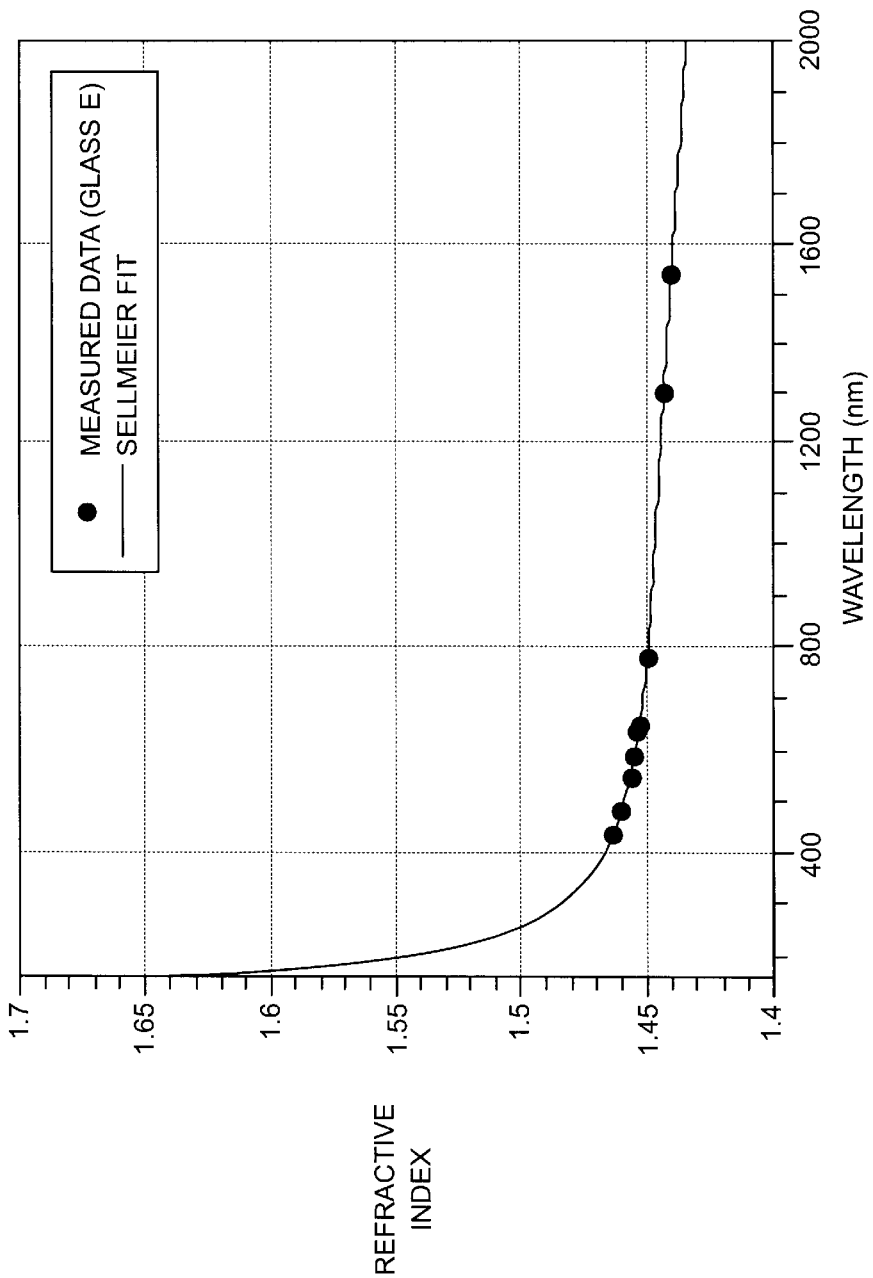
FIG. 4 is a refractive index as a function of wavelength (nm) plot for glass E (0.8 wt. % F) showing 3-term Sellmeier fit and extrapolation to 157 nm in accordance with the invention.

FIG. 4 shows refractive index measurements on a silicon oxyfluoride Glass E (0.8 wt. %F) at eight wavelengths in the visible and near IR. The relationship between refractive index and wavelength is generally described by the three-term Sellmeier equation:

$$n(\lambda)^2 - 1 = \sum_{j=1-3}\left(\frac{S_j\lambda^2}{\lambda^2 - \lambda_j^2}\right) \quad (1)$$

where n(λ) is the refractive index at wavelength λ (in μm), and $S_j$, $\lambda_j$ are the fitting parameters. Fitting the experimentally determined index values to the Sellmeier equation using a least squares fitting sequence, the parameters for Glass E were determined to be: $S_1=0.69761$, $\lambda_1=0.06630$, $S_2=0.39778$, $\lambda_2=0.11832$, $S_3=0.88059$, and $\lambda_3=9.9118$. Extrapolating Equation 1 to 157-nm, the refractive index for Glass E was calculated as 1.6733 at 157-nm.

Figure 5:
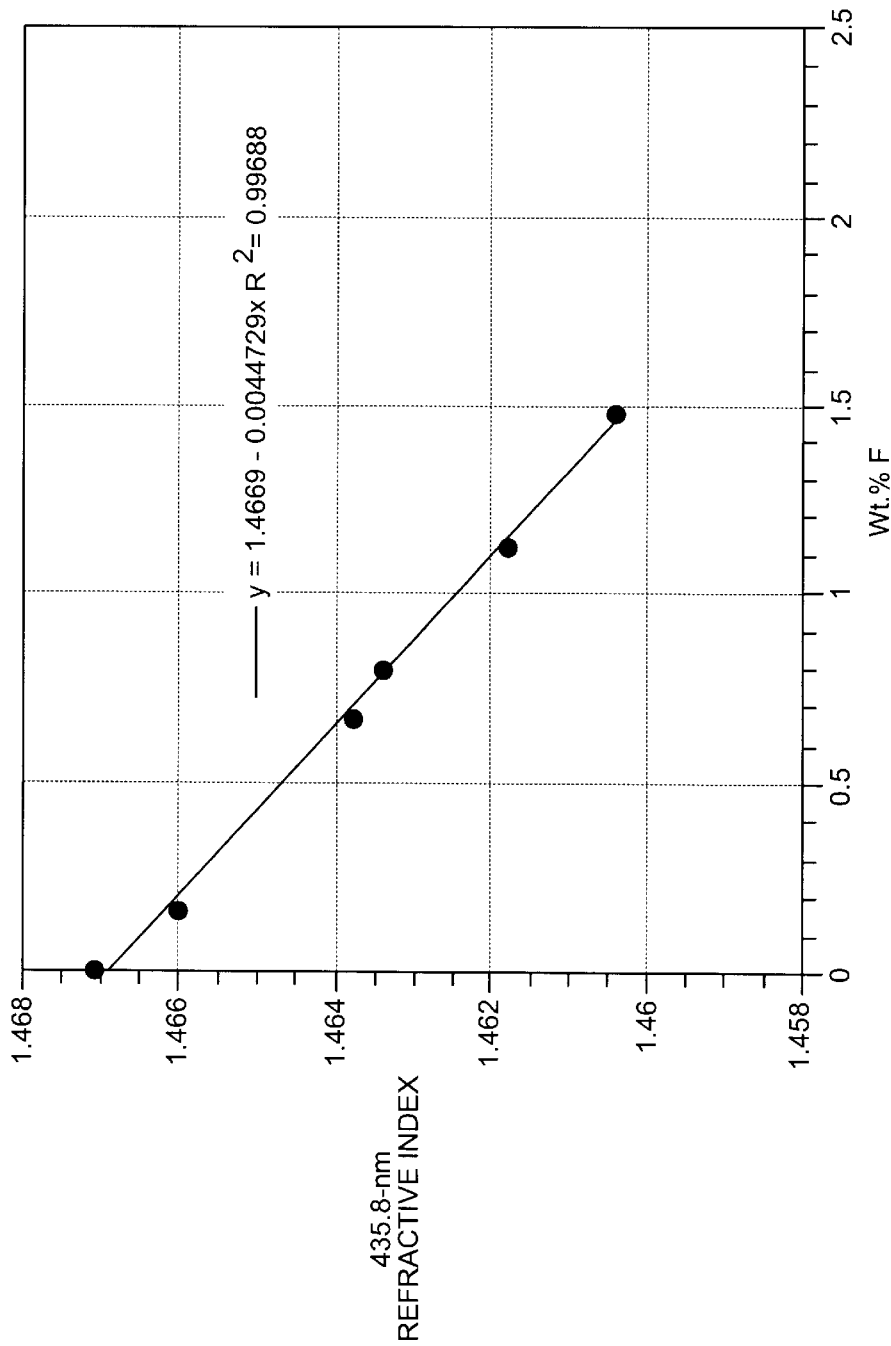
FIG. 5 is a 435.8 nm refractive index as a function of fluorine content (wt. % F) in accordance with the invention.
Figure 6:
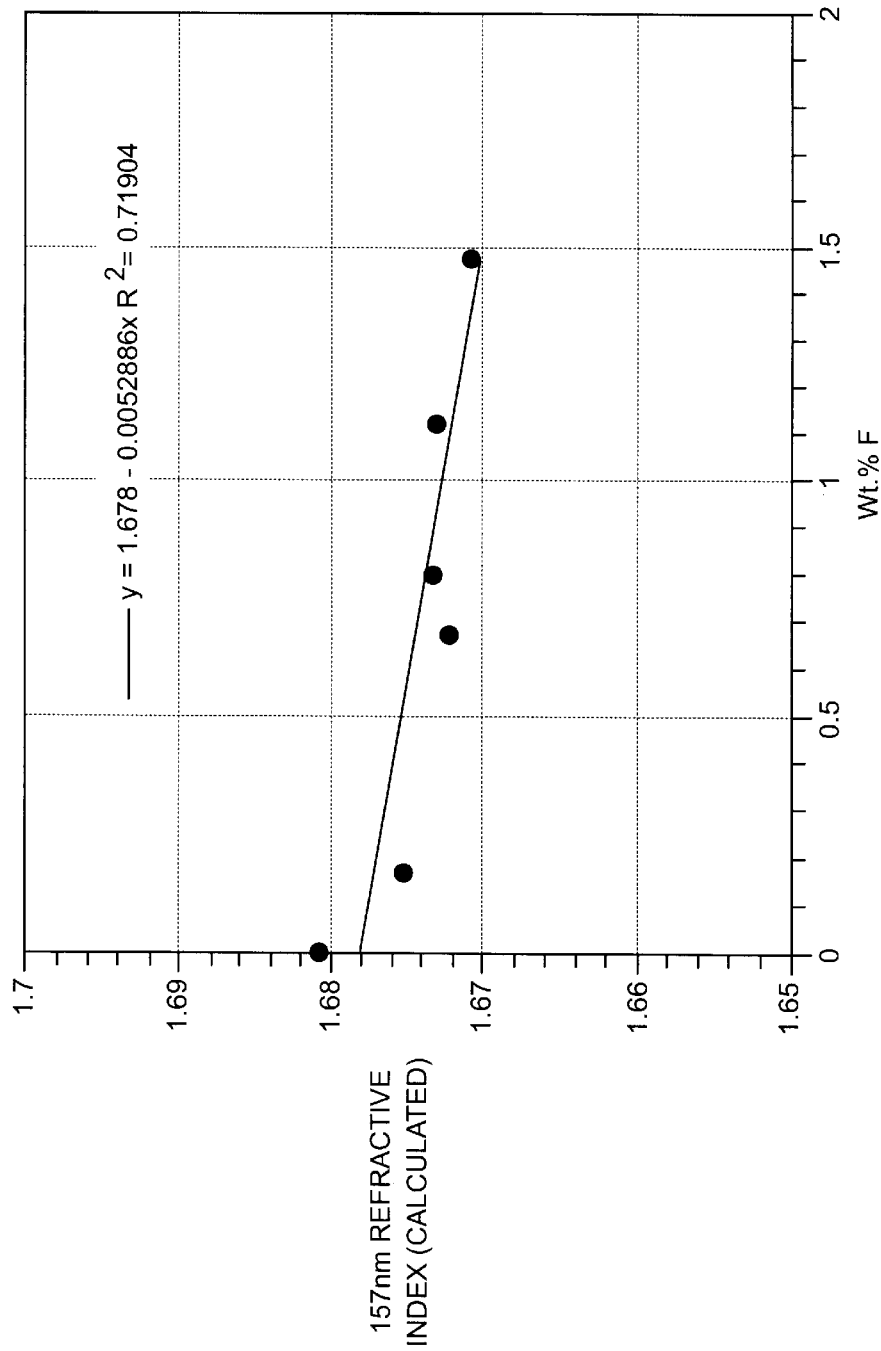
FIG. 6 is a 157 nm refractive index (calculated from Sellmeier fit) as a function of fluorine content (wt. % F) plot in accordance with the invention.

It is known that the refractive index of silica is decreased by the addition of fluorine. To see the effect at 157-nm, we performed refractive index measurements through the visible and near IR and Sellmeier analyses as described above on dry silica glasses containing from 0 to 1.5 wt. % F. FIG. 5 shows a plot of refractive index measurements at 435.8-nm as a function of fluorine content. FIG. 6 shows the plot of calculated 157-nm index as a function of fluorine content. From linear regressions performed on the data in FIGS. 5 and 6, a change in index (100 Δn/n) of −0.30% per 1 wt. % F at 435.8-nm and −0.32% per 1 wt. % F at 157-nm was calculated.

Figure 7:
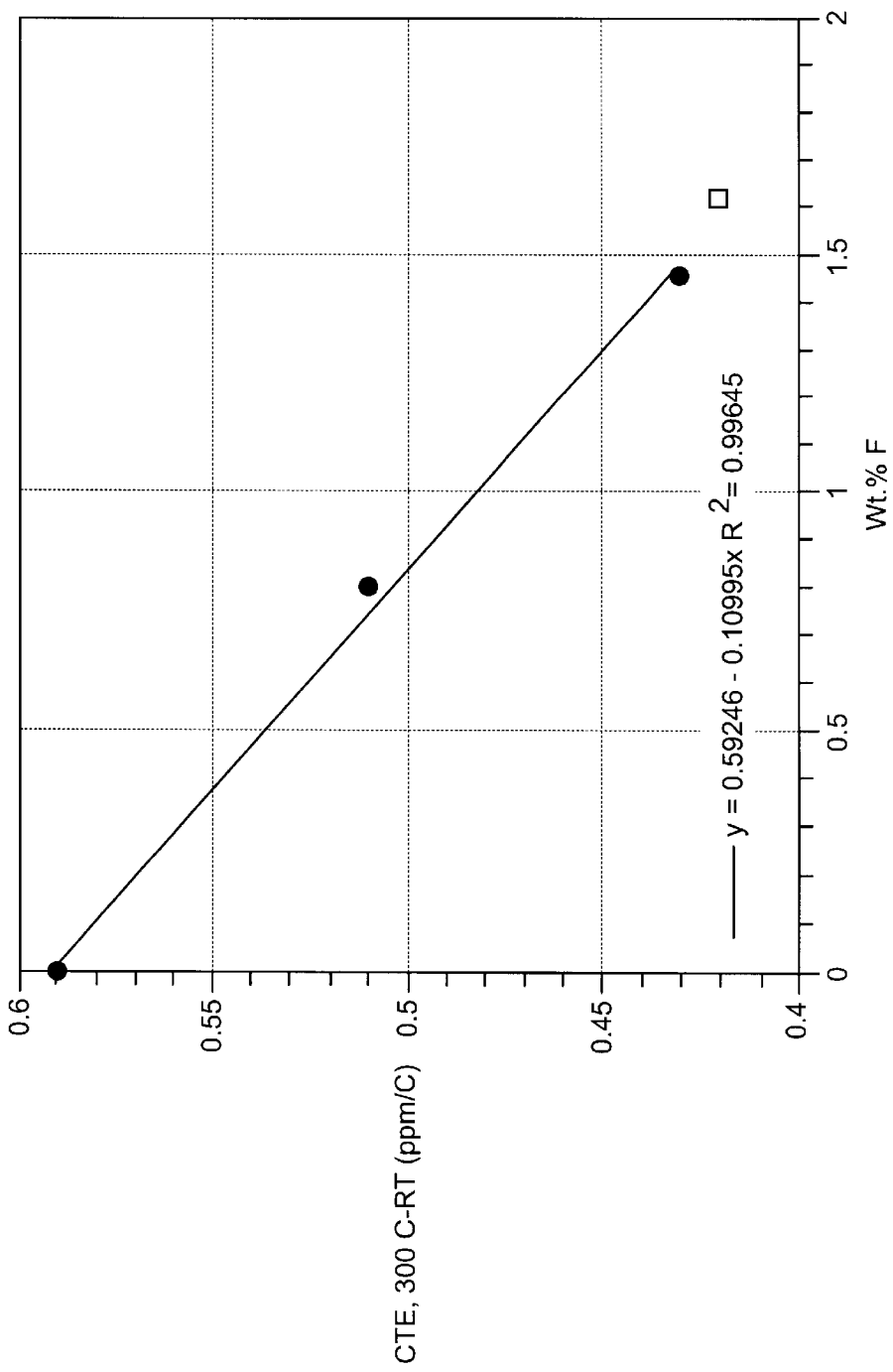
FIG. 7 is a coefficient of thermal expansion (CTE, 300° C.-RT (ppm/° C.)) as a function of fluorine content (wt. % F) in accordance with the invention.

We have further characterized the thermal and mechanical properties of dry fused silica over the same range of fluorine contents. As an example, FIG. 7 shows the coefficient of thermal expansion (CTE) as a function of fluorine level. The data were taken on samples that had been annealed by heating for 1 hour at the annealing point (viscosity=$10^{13.2}$ Poise) and cooling at a rate of 100° C./hour to room temperature. From the linear fit to the data in FIG. 7, it is found that fluorine produces a decrease in CTE of about 0.11 ppm/° C. per 1 wt. % F.

Table 1 summarizes the results of our optical and physical property measurements. The table compares properties of Corning HPFS® (Glass A) and silicon oxyfluoride glass (Glass E) and shows the effect of changes in fluorine content on the properties of the glass. Changes in properties with F content were taken from the linear fits to measured property data similar to FIG. 7.

TABLE 1

Comparison of optical and physical properties of standard UV excimer grade silica (Glass A) and modified fused silica (Glass E, 0.8 wt. % F). Optical properties are for 193 nm (Glass A) and 157 nm (Glass E). (nc = no change

| Property | Glass A | Glass E | Change in property (per 1 wt. % F addition |
|---|---|---|---|
| Optical: | | | |
| Refractive Index | 1.560841 | 1.6733 | −0.0053 |
| Thermal: | | | |
| Coefficient of Thermal Exapansion, 300° C.-RT (ppm/° C.) | 0.57 | 0.51 | −0.11 |
| Specific Heat, 298K (J/mol-K) | 46 | 46 | nc |
| Thermal Conductivity, 298K (W/m-K) | 1.3 | 1.3 | nc |
| Mechanical: | | | |
| Young's Modulus, MPa | 72700 | 69300 | −4511 |
| Shear Modulus, Mpa | 31400 | 29600 | −2059 |
| Poisson's Ratio | 0.16 | 0.17 | +0.005 |

Photomask polishing and coating deposition experiments were performed to reveal any gross differences between the processing of silicon oxyfluoride glass and standard high purity fused silica photomask substrates.

Polished substrates, 25 mm×25 mm×1.5 mm thick, were prepared from the silicon oxyfluoride glass. For comparison, 25 mm×25 mm×6.35 mm thick, substrates were also cut from a standard commercial silica photomask substrate. The substrates were cleaned in a sulfuric acid/peroxide solution and mask detergent, then spin-dried and baked at 120° C. Cr films, 100 nm thick, were deposited by sputtering.

Film adhesion measurements were made by indentation and scratch testing using a Nanoindenter II. Under the same test conditions, delamination of the Cr film could not be induced on either type of substrate. These results indicate good film adhesion.

Substrates of Corning HPFS® fused silica and of the silicon oxyfluoride glass were polished to 0.2 nm rms surface roughness using chemical mechanical polishing.

The theoretical transmission limit of the silicon oxyfluoride glass, defined as losses due only to reflections, can be calculated from the refractive index of the material at 157-nm (n) using the formula:

$$\%T(theor.) = \frac{2n}{n^2 + 1} \times 100 \qquad (2)$$

This equation for % T(theor.) is based on multiple internal reflections. From the linear fit to the experimental data in FIG. 6, a 157-nm refractive index for Glass C (0.94 wt. % F) of 1.6730 was calculated. Using this index in Equation 2, a theoretical transmission limit of about 88% at 157-nm is predicted. Since this limit is based on a refractive index calculated from an extrapolation of the Sellmeier equation, it should be considered an approximation based on the best available data.

The measured transmission of Glass C was 73.8% through 6.4 mm. Improvements towards the theoretical limit of 88% could come from decreases in surface losses or internal losses. Surface losses are highly dependent on sample surface preparation and cleaning. The important material property, is the internal transmittance of the glass. The internal transmittance of silicon oxyfluoride Glass C was 87.9%/cm. 157-nm is very close to the UV absorption edge of the silicon oxyfluoride where residual impurities (including OH and Cl) and other defects in the glass structure have a large effect on the transmittance.

The silica glass structure can be described as a network of $SiO_4$ tetrahedra bonded together at all four corners and randomly oriented with respect to one another. Water is incorporated into the structure as ≡Si—OH (where ≡ indicates bonding to the $SiO_4$ network) such that the bond to the neighboring tetrahedron is broken at the OH group. OH produces absorption in the deep UV at <175-nm. Fluorine is similarly incorporated into the structure as ≡Si—F with the connectivity of the network being broken at the F atom. Electronic transitions associated with the Si—F bond are expected to be at higher energies (shorter wavelengths) than those from the Si—O network bonds.

The fluorine-doped silica structure is particularly resistant to damage by $F_2$ excimer laser irradiation. Here, we have shown that formation of E' color centers is highly suppressed in the fluorinated structure, even in silica containing a very low concentration of fluorine. It is possible that the fluorine reduces the number of precursor sites for color center formation such as weak or strained bonds and oxygen-deficient Si—Si defects.

Figure 11:
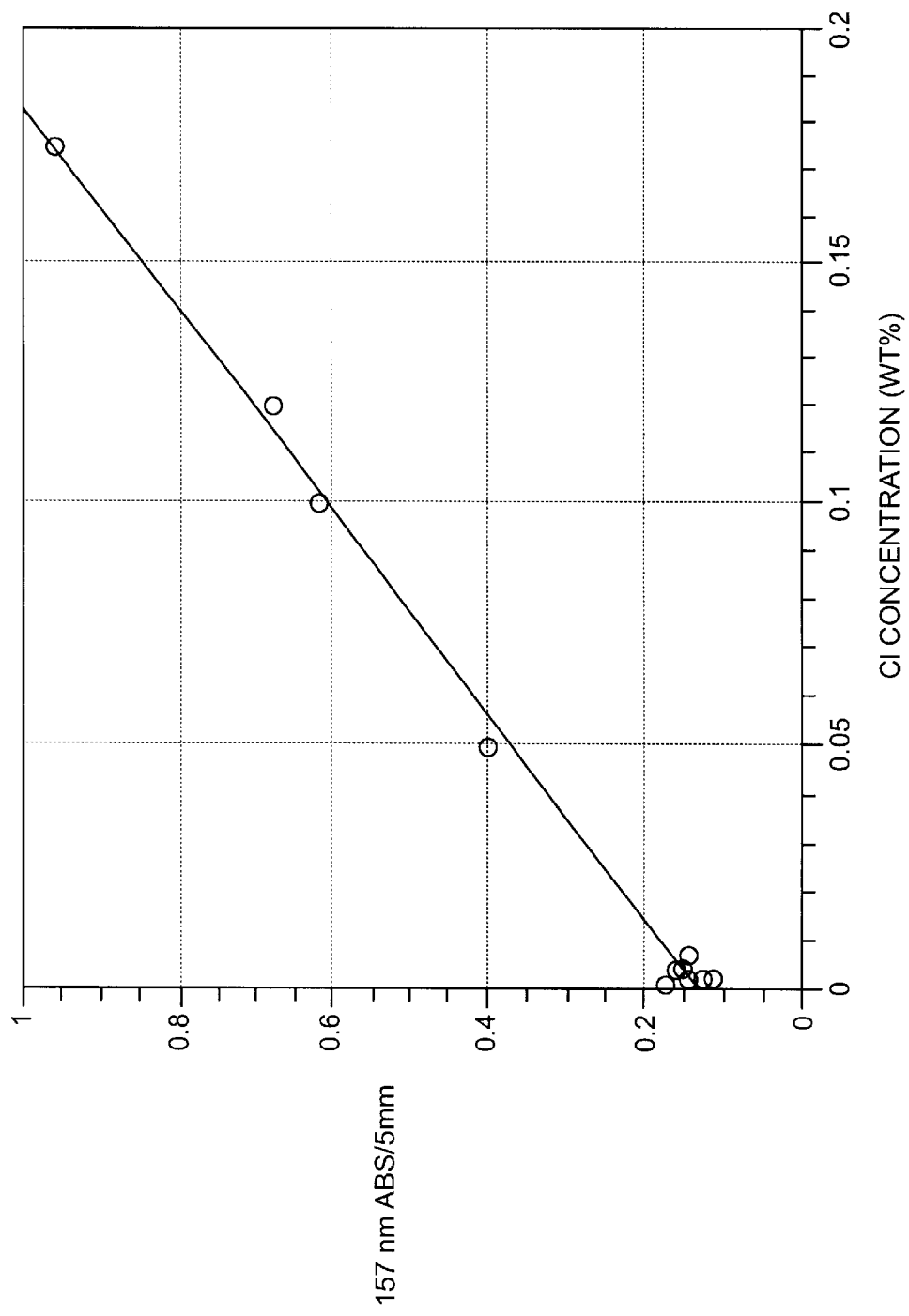
FIG. 11 is a plot of 157 nm absorption of 5 mm thick samples vs. chlorine concentration (Cl wt. %) in accordance with the invention.

Chlorine content has been found to drastically effect the 157 nm transmission of the silicon oxyfluoride glass. A plot of 157 nm absorption of 5 mm thick silicon oxyfluoride glass samples versus the chlorine concentrations of the samples shows as in FIG. 11, that the 157 nm transmission is improved by low levels of chlorine, preferably with the glass chlorine free.

Our measurements show that silicon oxyfluoride glass has similar optical, thermal and mechanical properties as standard UV excimer grade silica. The addition of fluorine to the silica structure does produce measurable changes in most of these properties. Thermal expansion, Young's modulus, and shear modulus all decrease with fluorine content, while thermal conductivity and specific heat are largely unaffected. The smaller thermal expansion of silicon oxyfluoride glass may prove to be a benefit in 157 nm applications and can be utilized in other lithography and photomask applications such as reflective lithography systems, particularly very short wavelength systems. The refractive index of the glass is also decreased by fluorine. However, because of the index dispersion, the refractive index of silicon oxyfluoride glass is considerably higher at 157 nm than standard excimer grade fused silica at 193 nm. In comparison, $CaF_2$ has a substantially higher thermal conductivity and lower 157 nm refractive index than silica both of which are beneficial to the photomask application, but its high thermal expansion coefficient and crystalline nature make fabrication and mask processing very difficult.

Silicon oxyfluoride with internal transmittances as high as 87.9%/cm have been prepared. Scattering measurements indicate that scattering losses at 157-nm are very low so that the primary loss mechanism in the glass is absorption. From refractive index measurements, the theoretical limit for measured transmission (reflection losses only) is predicted to be around 88% at 157 nm. The optical, thermal and mechanical properties of silicon oxyfluoride glass are different from those of standard UV excimer grade fused silica, due to the addition of fluorine to the glass.

In a preferred embodiment the invention includes a below 193 nm VUV transmitting glass photomask substrate for photolithography at wavelengths of about 157 nm. The VUV transmitting glass substrate comprises high purity oxyfluoride glass with an OH content below 50 ppm by weight, hydrogen content below $1 \times 10^{17}$ molecules $cm^3$, and a fluorine content in the range of 0.1 to 0.4 weight percent. Preferably the glass has a Cl content below 5 ppm, more preferably below 1 ppm, and most preferably with the glass being essentially free of chlorine. Preferably the glass has a molecular hydrogen content below $3 \times 10^{16}$ molecules/$cm^3$, and more preferably has no detectable molecular hydrogen content. Preferably the glass has an OH content below 10 ppm by weight, more preferably below 1 ppm by weight, and most preferably has no detectable OH content and is essentially OH free. Preferably the glass is comprised of Si, O, and F and is essentially free of OH, Cl and $H_2$. Preferably the silicon oxyfluoride glass photomask substrate has an internal transmittance at 157 nm of at least 89%/cm, most preferably with the substrate having a measured transmittance of at least 79% through a thickness of the photomask substrate with the substrate being about 6 mm thick, such as 6.35 mm thick.

In a preferred embodiment the invention includes a process of making a VUV transmitting glass having high resistance to optical damage to excimer laser radiation in the 157 nm wavelength region. The process includes providing a plurality of $SiO_2$ particles and dehydrating the particles. The process includes fluorine doping and consolidating the particles to form a dry, non-porous monolithic body of transparent fused silicon oxyfluoride glass with a fluorine content less than 0.5 weight percent.

Preferably the particles are reacted with a fluorine-containing gas such that the amount of fluorine incorporated into the glass resulting from consolidation is in the range of 0.1 to 0.4 weight percent. Preferably the fluorine-containing gas is selected from the group consisting of $CF_4$, $SiF_4$, $F_2$, $SF_6$, $C_2F_6$, $C_3F_8$ and mixtures thereof. In a preferred embodiment the particles are doped with the fluorine-containing gas at a doping temperature in the range of 750° C. to 1050° C., more preferably in the range of 800° C. to 1000° C., and most preferably at about 800° C. (±25° C.). The preferred fluorine-containing gas for these preferred doping temperatures is $SiF_4$ A preferred fluorine doping furnace treatment atmosphere for these temperatures is a mixture of $SiF_4$, $O_2$ and helium, most preferably with $O_2$ being present during the fluorine doping exposure. A preferred fluorine doping furnace treatment atmosphere is about 5% SiF (±2%, more preferably ±1%) with about 80% $O_2$ (±10%, more preferably ±5%) with the remainder being helium. After the fluorine doping exposure the doped particles are consolidated into silconoxyfluoride glass in a consolidation furnace sintering zone with a sintering temperature in the range of 1400° C. to 1550° C. Preferably the particles are sintered and consolidated in a cosolidatin furnace atmosphere of pure helium, such as by down feeding the soot particle blank from a furnace doping zone in to the sintering zone after the supply of fluorine-containing $SiF_4$ gas and $O_2$ is terminated.

The invention includes a $F_2$ laser-induced absorption resistant silicon oxyfluoride glass suitable for use in the 157 nm wavelength region, the glass having a stable and high transmission at 157.6 nm with a fluorine content less than 0.5 weight % such that the glass has a transmission loss at 157.6 nm<1% after exposure to a $F_2$ excimer laser for 60 million pulses at 0.1 mJ/cm$^2$-pulse. The silicon oxyfluoride glass preferably is essentially free of OH groups, has less than $5 \times 10^{16}$ molecules/cm$^3$ of molecular hydrogen, and a fluorine content in the range of about 0.1 to 0.4 weight %.

The invention includes a $F_2$ laser-induced absorption resistant lithography glass comprising a silicon oxyfluoride glass having an OH content less than 5 ppm, by weight, a Cl content less than 5 ppm by weight, and a fluorine content of 0.1 to 0.4 weight % with a 157 nm internal transmission of at least 80%/cm, more preferably 85%/cm. Preferably the glass has a H2 content less than $1 \times 10^{17}$ molecules/cm$^3$. The silicon oxyfluoride glass is resistant to laser-induced absorption and has a 157 nm transmission loss <1% after exposure to a 157 nm laser for 60 million pulses at 0.1 mJ/cm$^2$-pulse. The silicon oxyfluoride glass has a resistance to 157.6 nm induced absorption, with the fluorine content inhibiting 165 nm absorption oxygen-deficient centers. Preferably the glass has a 165 nm absorption less than 0.4 (absorption units/5 mm) after exposure to a 157 nm laser for 41.5 million pulses at 2 mJ/cm$^2$-pulse of 157 nm laser, and most preferably the 165 nm absorption is less than 0.2 (absorption units/5 mm). Preferably the Cl content is less than 1 ppm and the OH content is less than 1 ppm, preferably with the glass consisting essentially of Si, O and F. In an embodiment the glass is a VUV transmitting photomask. In an embodiment the glass is a VUV phase shifting photomask. Preferably the glass photomasks have a resistance to laser induced oxygen-deficient centers, preferably with the glass essentially free of metal to metal Si—Si bonds and free of a 165 nm absorbing center and has an internal transmission at 165 run of at least 85%/cm.

The invention includes a VUV pattern printing method. The pattern printing method includes providing a below 164 nm radiation source for producing VUV photons, providing a silicon oxyfluoride glass having less than 5 ppm by weight OH, less than 5 ppm by weight Cl, a less than 0.5 weight percent fluorine content, and a 157 nm and 165 nm measured transmission of at least 75%/5 mm. The method includes transmitting the VUV photons through the silicon oxyfluoride glass, forming a pattern with the VUV photons, and projecting the pattern onto a VUV radiation sensitive printing medium to form a printed pattern. Embodiments of pattern printing methods of the invention are shown in FIGS. 8–9. In a preferred embodiment the VUV lithography pattern printing method which includes providing a VUV lithography photon radiation source, providing a silicon oxyfluoride lithography glass with less than 1 ppm OH, transmitting the VUV lithography photons through the silicon oxyfluoride lithography glass, forming a lithography pattern with the VUV photons, and projecting the lithography pattern onto a VUV radiation sensitive lithography printing medium to form a printed lithography pattern.

The VUV pattern printing method preferably includes lowering the VUV cut off wavelength of the silicon oxyfluoride glass by providing an $SiO_2$ glass forming precursor and doping with an F content to provide a silicon oxyfluoride glass with a 50% transmission VUV cut off wavelength below 160 nm and a 165 nm absorption less than 0.4 (absorption units/5 mm) after exposure to a 157 nm laser for 4.5 million pulses at 2 mJ/cm$^2$-pulse.

The invention provides superior transmission in the VUV with the silicon oxyfluoride glasses having high purity and being dry (<1 ppm OH). The inventive glasses have provided 157 nm transmissions such as 79.8%/6.35 mm (and 90%/cm internal T). The silicon oxyfluoride glass is preferably utilized as components for 157 nm lithography, particularly photomask substrates, pellicles, thin lenses and windows. For these lithography applications, it is not only important that the glass exhibits a high initial transmission, but the transmission must not decrease under exposure to the $F_2$ excimer laser. The glass provides a <1% transmission loss at 157.6 nm after exposure to the $F_2$ excimer laser for 60 million pulses at 0.1 mJ/cm$^2$-pulse. Our preferred silicon oxyfluoride glass compositions exhibit improved resistance to $F_2$ laser-induced absorption.

Figure 13A:
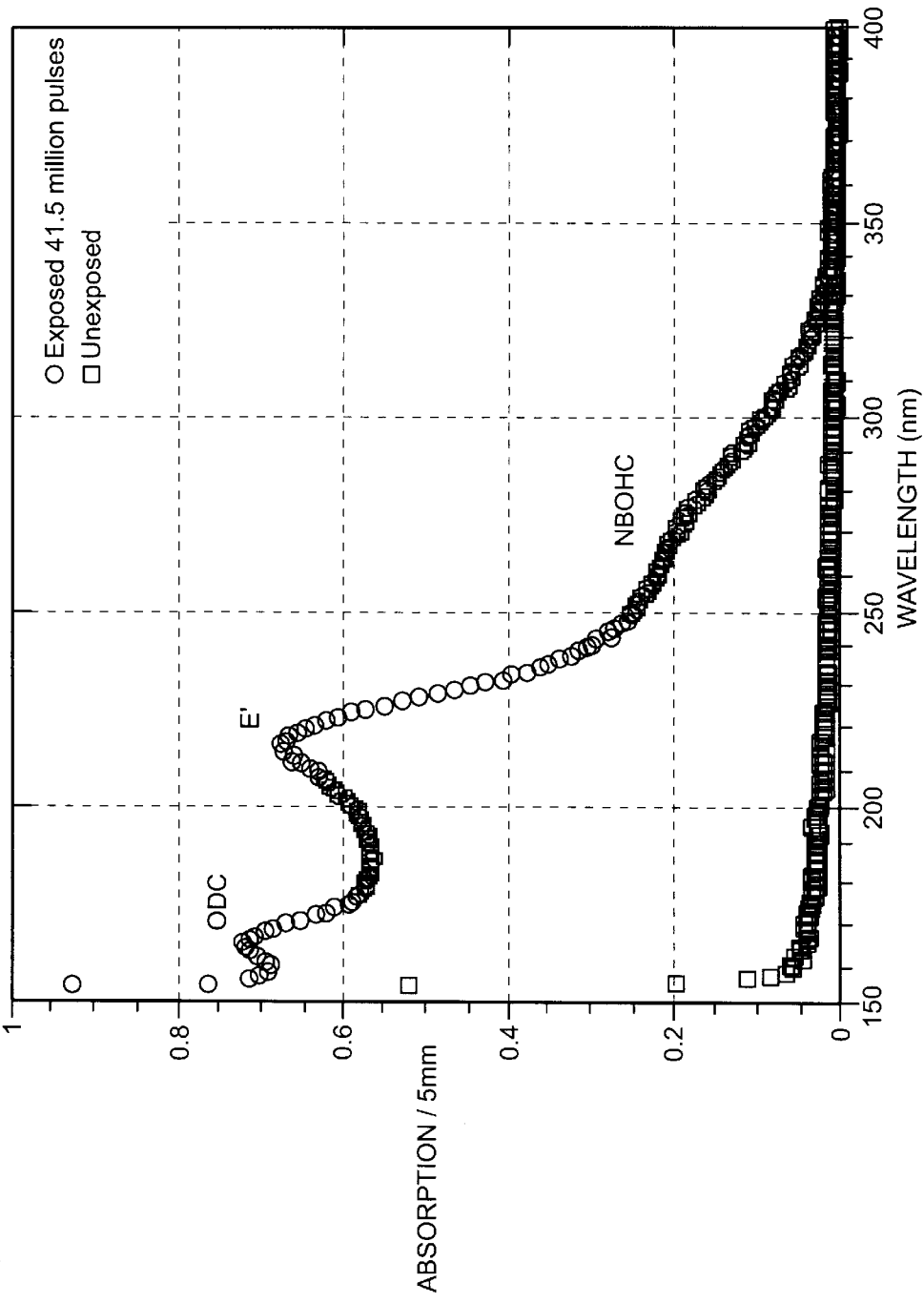
FIG. 13A is an absorption spectra before and after $F_2$ Excimer Laser Exposure (2 mJ/cm$^2$-pulse) (41.5 million pulses) of a high fluorine sample (<0.5 ppm OH by weight) with 1.7 wt. % F.
Figure 13B:
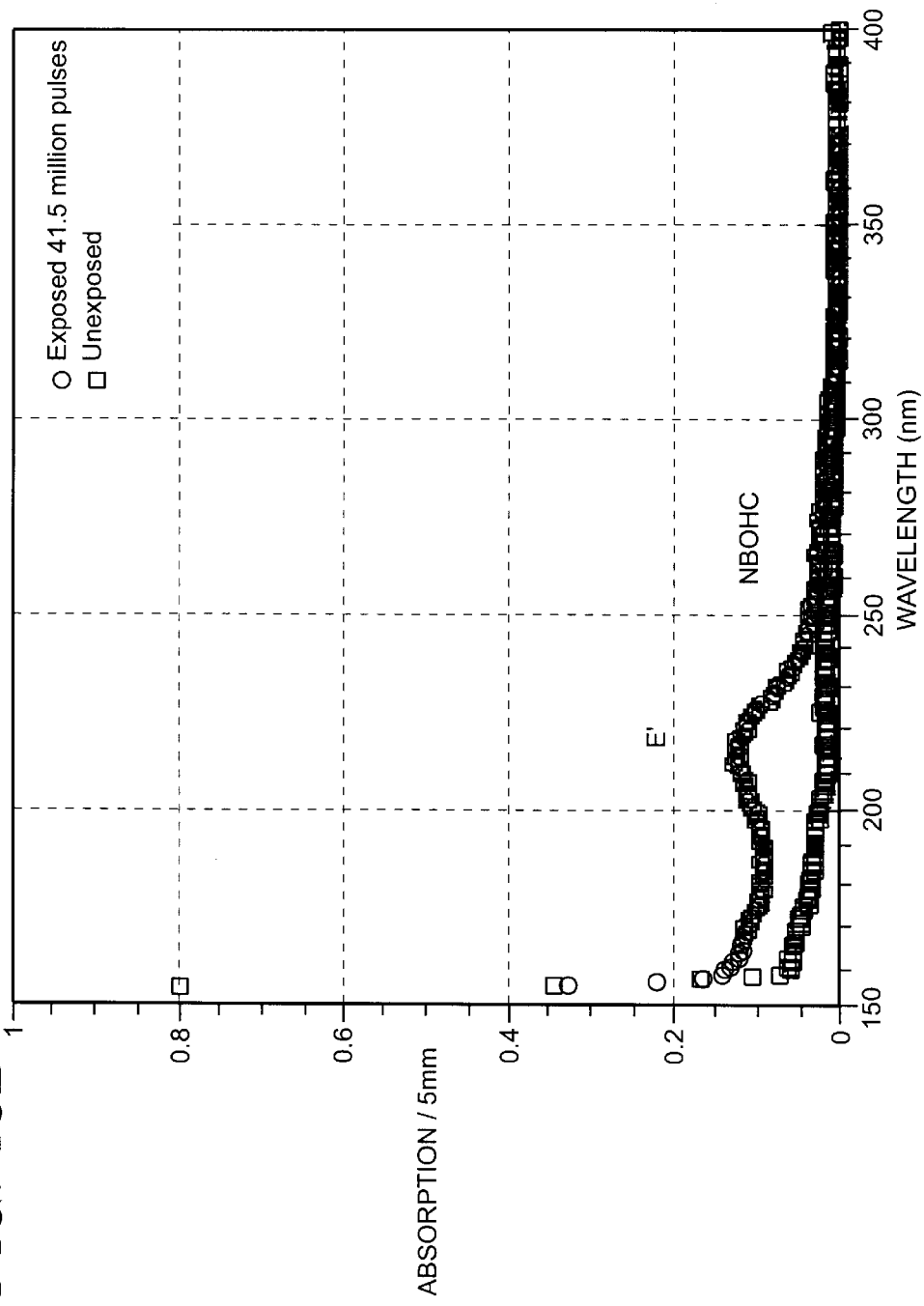
FIG. 13B is an absorption spectra before and after $F_2$ Excimer Laser Exposure (2 mJ/cm$^2$-pulse) (41.5 million pulses) of a low fluorine sample (<0.5 ppm OH by weight) with 0.12 wt. % F.

We have discovered that although the addition of fluorine to a dry silica glass improves its transmission in the vacuum ultraviolet, particularly near the UV edge (e.g., at 157 nm), high concentrations of fluorine in the glass are detrimental to its laser damage resistance. Specifically, we have found that under $F_2$ excimer laser exposure, the induced absorption in the glass is proportional to the fluorine content of the glass. As the fluorine content increases, the 157.6 nm induced absorption increases. FIG. 12 is a plot of 157.6nm induced absorption vs. exposure time for three silicon fluoride glasses with different fluorine contents. Clearly the magnitude of the induced absorption increases with fluorine content. In order to understand what defect centers are contributing to the induced absorption, we measured the absorption spectra of the glasses before and after exposure (see FIG. 13). The plots in FIG. 13 are for the glasses with the highest and lowest fluorine levels in FIG. 12 and for a dry silica glass containing no fluorine. Three defect centers were identified in the exposed glasses: non-bridging oxygen hole centers (260 nm) (NBOHC), E' centers (215 nm), and oxygen-deficient centers (165 nm) (ODC). Notice in particular that the concentration of oxygen-deficient centers formed under the $F_2$ laser exposure is dependent on the fluorine concentration. Note that the low fluorine silicon oxyfluoride glass of FIG. 13b (0.12 wt. % F) has good laser durability and is resistant to $F_2$ laser induced absorption and free of laser induced oxygen-deficient centers at 165 nm as compared to FIG. 13a. We have seen a similar effect under ArF (193 nm) excimer laser exposure, although the dependence on fluorine concentration does not appear to be nearly as strong as under the $F_2$ excimer laser (see FIG. 14). Finally, we exposed a high fluorine silica (1.7 wt. % F) and a low fluorine silica (0.12 wt. % F) to the $F_2$ laser under a low fluence condition to simulate the use condition for a 157 nm photomask substrate. FIG. 15 shows a plot of 157.6 nm transmission vs. exposure time at 0.2 mJ/cm$^2$-pulse. The low fluorine glass retained its high initial transmission (73.5%/6.35 mm) over 41.5 million pulses whereas the high fluorine glass showed significant loss of transmission after just 10 million pulses.

The 1.7 wt. % F glass of FIGS. 12, 13a, 14a, and 15 was made from a silica soot preform. The silica soot preform, was prepared using $SiCl_4$ as the source compound. The soot blank was held in a furnace for 60 minutes at 1100° C. under a Cl$_2$/He atmosphere (0.066 slpm Cl$_2$, 20.64 slpm He). The temperature was ramped to 1225° C. over 45 mins, and the soot preform was exposed to a CF$_4$/He atmosphere (4 slpm CF$_4$, 12 slpm He) for 180 minutes. The preform was driven into the high temperature (max T=1480° C.) part of the furnace under the same gas flows to produce a fully dense, F—SiO$_2$ glass. The fluorine concentration in the glass determined by microprobe analysis was 1.7 wt. % F and the chlorine concentration was 14 ppm wt.

A 1.2 wt. % F glass was made from a silica soot preform. The silica soot preform, was prepared using SiCl$_4$ as the source compound. The soot blank was held in a furnace for 180 minutes at 1000° C. under a Cl$_2$/He atmosphere (0.066 slpm Cl$_2$, 20.64 slpm He). The temperature was ramped to 1225° C. over 45 mins, and the soot preform was exposed to a CF$_4$/He atmosphere (1.6 slpm CF$_4$, 18.4 slpm He) for 120 minutes. The preform was driven into the high temperature (max T=1480° C.) part of the furnace under the same gas flows to produce a fully dense, F—SiO$_2$ glass. The fluorine concentration in the glass determined by microprobe analysis was 1.2 wt. % F.

The 0.94 wt. % F glass of FIG. 12 was made from a silica soot preform. The silica soot preform, 1532 g, was prepared using SiCl$_4$ as the source compound. The soot blank was held in a furnace for 60 minutes at 1100° C. under a Cl$_2$/He atmosphere (0.066 slpm Cl$_2$, 40.64 slpm He). The temperature was ramped to 1225° C. over 45 mins, and the soot preform was exposed to a CF$_4$/He atmosphere (0.8 slpm CF$_4$, 39.2 slpm He) for 150 minutes. The preform was driven into the high temperature (max T=1480° C.) part of the furnace under the same gas flows to produce a fully dense, F—SiO$_2$ glass. The fluorine concentration in the glass determined by microprobe analysis was 0.94 wt. % F.

The 0.12 wt. % F glass of FIGS. 12, 13b, 14b, and 15 was made from a silica soot preform. The silica soot preform, was prepared using OMCTS as the source compound. The soot blank was held in a furnace for 120 minutes at 1000° C. under a CF$_4$/He atmosphere (0.4 slpm CF$_4$, 40 slpm He). The preform was then driven into the high temperature (max T=1480° C.) part of the furnace under a pure He flow to produce a fully dense, F—SiO$_2$ glass. The fluorine concentration in the glass determined by microprobe analysis was 0.12 wt. % F.

Figure 13C:
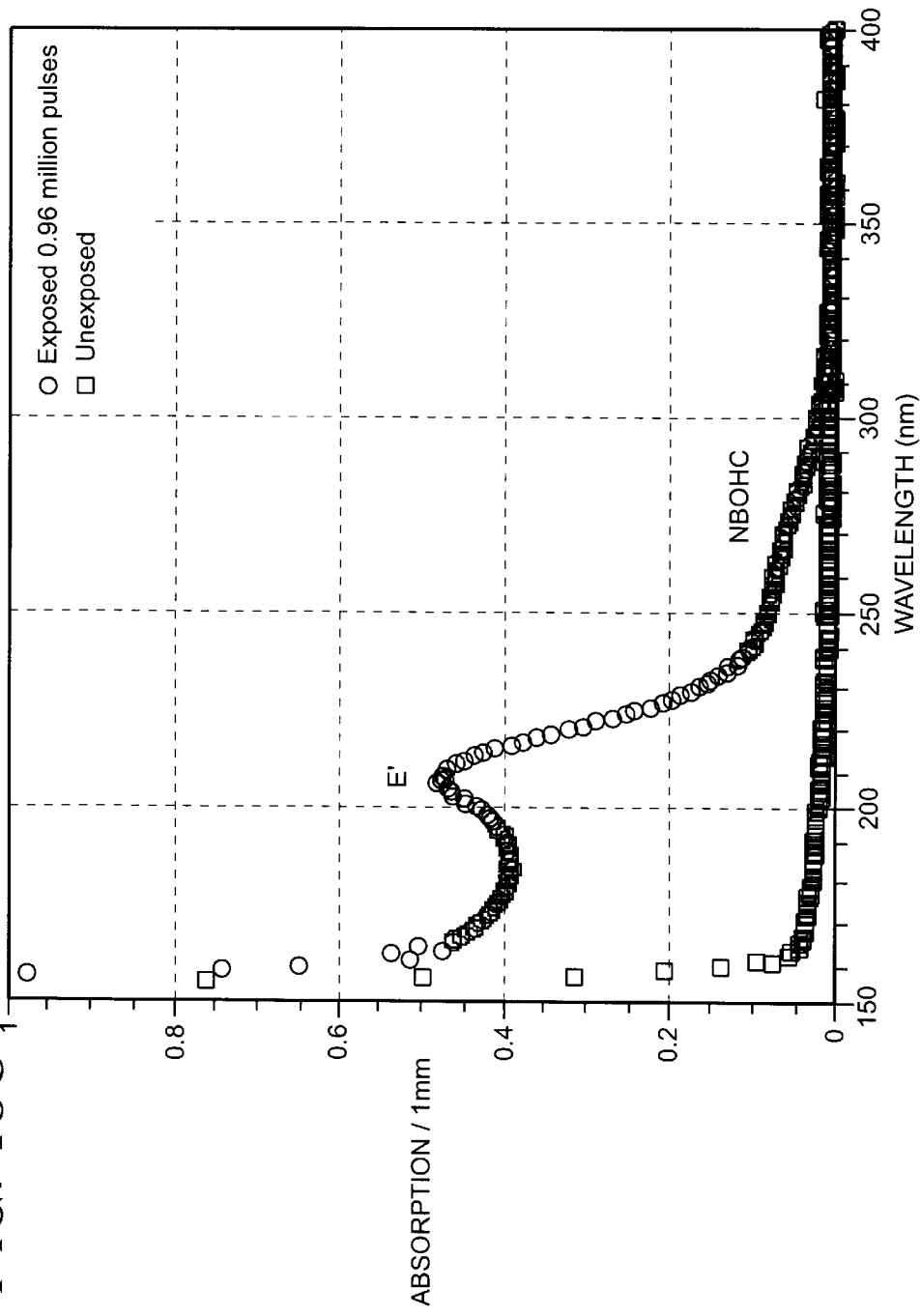
FIG. 13C is an absorption spectra before and after $F_2$ Excimer Laser Exposure (4.5 mJ/cm$^2$-pulse) (0.96 million pulses) of a no fluorine dry (<0.5 ppm OH by weight) sample with 0 wt. % F.
Figure 14C:
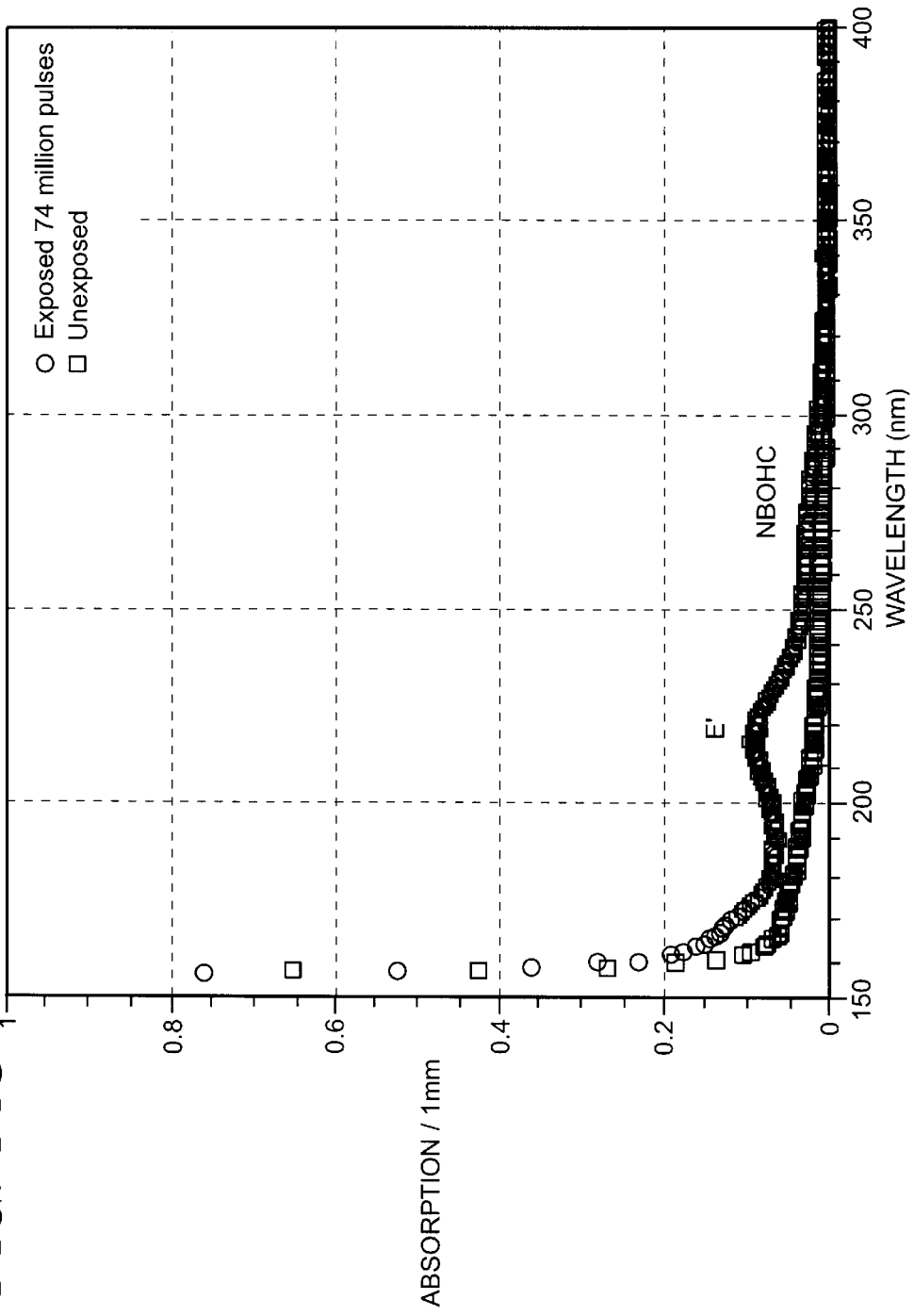
FIG. 14C is an absorption spectra before and after ArF Excimer Laser Exposure (25 mJ/cm$^2$-pulse) (74 million pulses) of a no fluorine dry (<0.5 ppm OH by weight) sample with 0 wt. % F.
Figure 15:
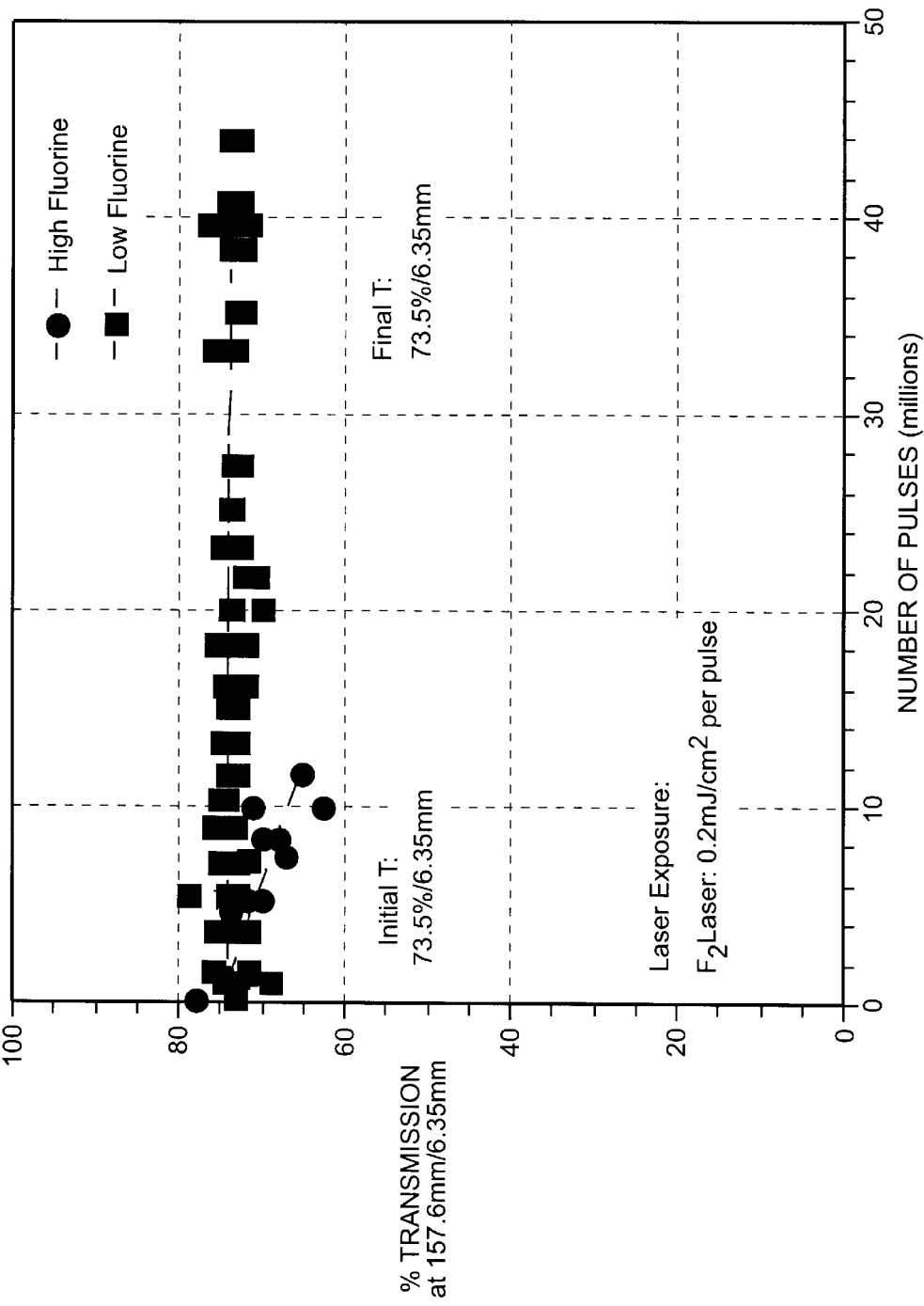
FIG. 15 is an online 157 nm transmission comparison as a function of exposure time with the Y-axis % transmission at 157.6 nm/6.35 mm vs X-axis Number of Pulses (millions) of $F_2$ Excimer Laser (0.2 mJ/cm$^2$ per pulse) of a high fluorine sample (<0.5 ppm OH by weight) with 1.7 wt. % F and a low fluorine sample (<0.5 ppm OH by weight) with 0.12 wt. % F.

The dry No Fluorine glass of FIGS. 13c and 14c was made from a silica soot preform. The silica soot preform was made using OMCTS as the source compound. The soot preform was dried at 1100–1150° C. and sintered to a fully dense glass under a Cl$_2$/He atmosphere. Microprobe analysis showed the glass to contain no fluorine and 1290 ppm wt of chlorine.

A 0.53 wt. % F glass was made from a silica soot preform. The silica soot preform, 892 g, was prepared using OMCTS as the source compound. The soot blank was held in a furnace for 240 minutes at 1000° C. under a SiF$_4$/O$_2$/He atmosphere (1 slpm SiF$_4$, 16 slpm O2, 3 slpm He). The preform was then driven into the high temperature (max T=1480° C.) part of the furnace under a pure He flow to produce a fully dense, F—SiO$_2$ glass. The fluorine concentration in the glass determined by microprobe analysis was 0.53 wt. % F and the chlorine concentration was 19 ppm wt.

A 0.31 wt. % F glass was made from a silica soot preform. The silica soot preform, was prepared using OMCTS as the source compound. The soot blank was held in a furnace for 240 minutes at 800° C. under a SiF$_4$/O$_2$/He atmosphere (1 slpm SiF$_4$, 16 slpm O$_2$, 3 slpm He). The preform was then driven into the high temperature (max T=1480° C.) part of the furnace under a pure He flow to produce a fully dense, F—SiO$_2$ glass. The fluorine concentration in the glass determined by microprobe analysis was 0.31 wt. %F.

A 0.26 wt. % F glass was made from a silica soot preform. The silica soot preform, was prepared using OMCTS as the source compound. The soot blank was held in a furnace for 240 minutes at 800° C. under a SiF$_4$/O$_2$/He atmosphere (0.6 slpm SiF$_4$, 16 slpm O$_2$, 3.4 slpm He). The preform was then driven into the high temperature (max T=1480° C.) part of the furnace under a pure He flow to produce a fully dense, F—SiO$_2$ glass. The fluorine concentration in the glass determined by microprobe analysis was 0.26 wt. % F and the chlorine concentration was 15 ppm wt.

A 0.17 wt. % F glass was made from a silica soot preform. The silica soot preform, was prepared using SiCl$_4$ as the source compound. The soot blank was held in a furnace for 60 minutes at 1000° C. under a Cl$_2$/He atmosphere (0.066 slpm Cl$_2$, 40.64 slpm He). The temperature was ramped to 1100° C. over 20 mins, and the soot preform was exposed to a CF$_4$/He atmosphere (0.4 slpm CF$_4$, 40 slpm He) for 120 minutes. The preform was driven into the high temperature (max T=1480° C.) part of the furnace under a pure He flow to produce a fully dense, F—SiO$_2$ glass. The fluorine concentration in the glass determined by microprobe analysis was 0.17 wt. %.

A 0.05 wt. % F glass was made from a silica soot preform. The silica soot preform, was prepared using OMCTS as the source compound. The soot blank was held in a furnace for 120 minutes at 800° C. under a SiF$_4$/O$_2$/He atmosphere (1 slpm SiF$_4$, 4 slpm O$_2$, 15 slpm He). The SiF$_4$ and O$_2$ were turned off and the preform was held at 800° C. under a pure He atmosphere for 120 minutes. The preform was then driven into the high temperature (max T=1480° C.) part of the furnace under a pure He flow to produce a fully dense, F—SiO$_2$ glass. The fluorine concentration in the glass determined by microprobe analysis was 0.05 wt. % F.

Preferably our silicon oxyfluoride glass has a fluoride content less than 0.5 wt. % F. Our <0.5 wt. % F dry silicon oxyfluoride glass exhibits good laser durability and suitability for applications involving exposure to F$_2$ excimer laser radiation. Our preferred composition range for attaining both high initial transmission and low induced absorption is 0.1–0.4 wt. % F.

The invention includes a VUV transmitting silicon oxyfluoride glass having an OH content less than 5 ppm by weight, a fluorine content of at least 0.1 weight %. Preferably the glass consists essentially of Si, O and F with the glass having an internal transmission in the wavelength range of 157 nm to 175 nm of at least 85%/cm. Preferably the glass has a 165 nm absorption less than 0.4 (absorption units/5 mm) after exposure to a 157 nm laser for 41.5 million pulses at 2 mJ/cm$^2$-pulse.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A below 193 nm VUV transmitting glass photomask substrate for photolithography at wavelengths of about 157 nm comprising high purity silicon oxyfluoride glass with an OH content below 50 ppm by weight, hydrogen content below $1 \times 10^{17}$ molecules/cm$^3$, and fluorine content in the range of 0.1 to 0.4 weight percent.

2. A VUV photomask substrate according to claim 1 wherein the glass has a Cl content below 5 ppm.

3. A VUV photomask substrate according to claim 1 wherein the molecular hydrogen content is below $3 \times 10^{16}$ molecules/cm$^3$.

4. A VUV photomask substrate according to claim 1 wherein the fused silica is characterized by having no detectable molecular hydrogen content.

5. A VUV photomask substrate according to claim 1 wherein the OH content is below 10 ppm by weight.

6. A VUV photomask substrate according to claim 1 wherein the OH content below 1 ppm by weight.

7. A VUV photomask substrate according to claim 1 further characterized by having internal transmittance of at least 89%/cm at 157 nm wavelength region.

8. A VUV photomask substrate according to claim 7 wherein the measured transmittance is at least 79% through a thickness of the photomask substrate.

9. A VUV photomask substrate according to claim 8, wherein the thickness is about 6 mm.

10. A VUV photomask substrate according to claim 1, further characterized by being essentially free of chlorine.

11. A VUV photomask substrate according to claim 1, said silicon oxyfluoride glass comprised of Si, O and F and is essentially free of OH, Cl and $H_2$.

12. A VUV photomask substrate according to claim 1, wherein said glass has a low $H_2$ content such that less than $10^{18}$ $H_2$ molecules/m$^2$ are released when heated under a vacuum to about 1000° C.

13. A VUV photomask substrate according to claim 1, wherein said photomask substrate is free of an absorption peak at 4,100 cm$^{-1}$.

14. A silicon oxyfluoride glass suitable for use in the 157 nm wavelength region, said glass having essentially no OH groups, 0.1 to 0.4 weight % fluorine, and less than $5 \times 10^{16}$ molecules/cm$^3$ of molecular hydrogen.

15. A lithography glass comprising a silicon oxyfluoride glass, said silicon oxyfluoride glass having an OH content less than 5 ppm by weight, a Cl content less than 5 ppm by weight, a $H_2$ content less than $1 \times 10^{17}$ molecules/cm$^3$, and a fluorine content of 0.1 to 0.4 weight %, said glass having a 157 nm internal transmission of at least 85%/cm.

16. A lithography glass as claimed in claim 15, wherein said glass has a 157 nm transmission loss <1% after exposure to a 157 nm laser for 60 million pulses at 0.1 mJ/cm$^2$-pulse.

17. A lithography glass as claimed in claim 15, wherein said glass has a resistance to 157.6 nm induced absorption.

18. A lithography glass as claimed in claim 15, wherein said fluorine content inhibits 165 nm absorption oxygen-deficient centers.

19. A lithography glass as claimed in claim 15, wherein said glass has a 165 nm absorption less than 0.4 (absorption units/5 mm) after exposure to a 157 nm laser for 41.5 million pulses at 2 mJ/cm$^2$ pulse.

20. A lithography glass as claimed in claim 19, said 165 nm absorption less than 0.3 (absorption units/5 mm) after a 157 nm laser for 41.5 million pulses at 2 mJ/cm$^2$ pulse.

21. A glass as claimed in claim 20 wherein said 165 nm absorption is less than 0.2 (absorption units/5 mm).

22. A glass as claimed in claim 15 wherein said Cl content is less than 1 ppm and said OH content is less than 1 ppm.

23. A glass as claimed in claim 15 wherein said glass consists essentially of Si, O, and F.

24. A VUV transmitting photomask comprised of the glass as claimed in claim 15.

25. A VUV phase shifting photomask comprised of the glass as claimed in claim 15.

26. A photomask of the glass as claimed in claim 15, said photomask having a resistance to laser induced oxygen deficient centers.

27. A glass as claimed in claim 15 wherein said glass is essentially free of metal to metal Si—Si bonds.

28. A photomask as claimed in claim 27 wherein said glass is free of a 165 nm absorbing center and has an internal transmission at 165 nm of at least 85%/cm.

29. A VUV pattern printing method, said method comprising:

providing a below 164 nm radiation source for producing VUV photons, providing a silicon oxyfluoride glass having less than 5 ppm by weight OH, less than 5 ppm by weight Cl and a <0.5 weight percent fluorine content, and 157 nm and 165 nm measured transmission of at least 75%/5 mm, transmitting said VUV photons through said silicon oxyfluoride glass, forming a pattern with said VUV photons, and projecting said pattern onto a VUV radiation sensitive printing medium to form a printed lithography pattern.

30. A method as claimed in claim 29 wherein providing a silicon oxyfluoride glass comprises lowering the VUV cut off wavelength of the glass by providing an $SiO_2$ glass forming precursor, and doping with a F content to provide a silicon oxyfluoride glass with a 50% transmission VUV cut off wavelength below 160 nm and a 165 nm absorption less than 0.4 (absorption units/5 mm) after exposure to a 157 nm laser for 41.5 million pulses at 2 mJ/cm$^2$-pulse.

31. A method as claimed in claim 29 wherein said silicon oxyfluoride glass consists essentially of Si, O, and F and is essentially free of Si—Si bonds.

32. A VUV transmitting silicon oxyfluoride glass having an OH content less than 1 ppm by weight, a Cl content less than 1 ppm by weight, a $H_2$ content less than $1 \times 10^{17}$ molecules/cm$^3$, a fluorine content of 0.1 to 0.4 weight %, said glass having a 165 nm absorption less than 0.4 (absorption units/5 mm) after exposure to a 157 nm laser for 41.5 million pulses at 2 mJ/cm$^2$-pulse.

33. A VUV transmitting silicon oxyfluoride glass having an OH content less than 5 ppm by weight, a Cl content less than 5 ppm by weight, a $H_2$ content less than $1 \times 10^{17}$ molecules/cm$^3$, a fluorine content of at least 0.1 weight %, said glass consisting essentially of Si, O and F and having a 165 nm absorption less than 0.4 (absorption units/5 mm) after exposure to a 157 nm laser for 41.5 million pulses at 2 mJ/cm$^2$-pulse.

* * * * *